United States Patent
Kim et al.

(10) Patent No.: US 10,706,766 B2
(45) Date of Patent: Jul. 7, 2020

(54) DISPLAY PANEL AND METHOD FOR DRIVING THE DISPLAY PANEL

(71) Applicants: SAMSUNG ELECTRONICS CO., LTD., Suwon-si (KR); RESEARCH & BUSINESS FOUNDATION SUNGKYUNKWAN UNIVERSITY, Suwon-si (KR)

(72) Inventors: Jinho Kim, Suwon-si (KR); Yongsang Kim, Suwon-si (KR); Sangmin Shin, Suwon-si (KR); Kisun Kang, Suwon-si (KR); Jongsu Oh, Suwon-si (KR)

(73) Assignees: SAMSUNG ELECTRONICS CO., LTD., Suwon-si (KR); RESEARCH & BUSINESS FOUNDATION SUNGKYUNKWAN UNIVERSITY, Suwon-si (KR)

( * ) Notice: Subject to any disclaimer, the term of this patent is extended or adjusted under 35 U.S.C. 154(b) by 0 days.

(21) Appl. No.: 16/263,271

(22) Filed: Jan. 31, 2019

(65) Prior Publication Data

US 2020/0111404 A1 Apr. 9, 2020

(30) Foreign Application Priority Data

Oct. 4, 2018 (KR) .......................... 10-2018-0118310

(51) Int. Cl.
*G09G 3/32* (2016.01)
*G09G 3/20* (2006.01)
*H01L 27/15* (2006.01)

(52) U.S. Cl.
CPC ......... *G09G 3/2011* (2013.01); *G09G 3/2003* (2013.01); *G09G 3/2014* (2013.01);
(Continued)

(58) Field of Classification Search
CPC ...... G09G 3/20; G09G 3/2003; G09G 3/2011; G09G 3/2014; G09G 3/32;
(Continued)

(56) References Cited

U.S. PATENT DOCUMENTS 5,206,633 A * 4/1993 Zalph .................... G09G 3/2011
345/904
5,561,441 A * 10/1996 Hamano ................. G09G 3/367
345/91

(Continued)

FOREIGN PATENT DOCUMENTS

JP 2004-302410 A 10/2004
JP 2009-76684 A 4/2009
(Continued)

OTHER PUBLICATIONS

International Search Report (PCT/ISA/210) dated May 17, 2019 issued by the International Searching Authority in International Application No. PCT/KR2019/001359.
(Continued)

*Primary Examiner* — Joe H Cheng
(74) *Attorney, Agent, or Firm* — Sughrue Mion, PLLC

(57) ABSTRACT

A display panel is provided. In the display panel, a plurality of pixels respectively including a plurality of sub pixels are arranged in a matrix form on a glass. Each of the plurality of sub pixels includes a driving circuit disposed on the glass and configured to receive a pulse amplitude modulation (PAM) data voltage and a pulse width modulation (PWM) data voltage, and an inorganic light emitting device mounted on the driving circuit and configured to be electrically connected to the driving circuit, and to emit a light based on a driving current provided from the driving circuit. The PAM data voltage is applied at once to the plurality of pixels included in the display panel. The driving circuit is configured to control a grayscale of a light emitted by the inorganic (Continued)

light emitting device by controlling a pulse width of a driving current having an amplitude corresponding to the applied PAM data voltage based on the applied PWM data voltage.

20 Claims, 18 Drawing Sheets

(52) U.S. Cl.
CPC .............. *G09G 3/32* (2013.01); *H01L 27/156* (2013.01); *G09G 2300/043* (2013.01); *G09G 2300/0426* (2013.01); *G09G 2300/0452* (2013.01); *G09G 2300/0819* (2013.01); *G09G 2310/08* (2013.01); *G09G 2320/0633* (2013.01)

(58) Field of Classification Search
CPC ..... G09G 2300/0426; G09G 2300/043; G09G 2300/0452; G09G 2300/0819; G09G 2310/08; G09G 2320/0633; H01L 25/0753; H01L 27/15; H01L 27/156
See application file for complete search history.

(56) References Cited

U.S. PATENT DOCUMENTS

| | | | |
|---|---|---|---|
| 7,167,169 B2 | 1/2007 | Libsch et al. | |
| 7,276,863 B2 | 10/2007 | Lee et al. | |
| 7,623,123 B2* | 11/2009 | Kim | G09G 3/2011 345/100 |
| 7,675,249 B2* | 3/2010 | Furukawa | G09G 3/342 315/309 |
| 7,808,497 B2 | 10/2010 | Lo et al. | |
| 7,812,553 B2 | 10/2010 | Kang et al. | |
| 8,289,349 B2* | 10/2012 | Kobayashi | G09G 3/22 345/690 |
| 10,504,406 B2* | 12/2019 | Shigeta | G09G 3/3233 |
| 2005/0168417 A1* | 8/2005 | Ha | G09G 3/2011 345/76 |
| 2006/0158396 A1* | 7/2006 | Jo | G09G 3/3283 345/76 |
| 2006/0290718 A1 | 12/2006 | Ishida | |
| 2008/0007496 A1* | 1/2008 | Kim | G09G 3/3216 345/80 |
| 2008/0218469 A1* | 9/2008 | Kwok | G09G 3/3622 345/102 |
| 2009/0021178 A1 | 1/2009 | Furukawa et al. | |
| 2009/0115703 A1 | 5/2009 | Cok | |
| 2010/0188443 A1 | 7/2010 | Lewis et al. | |
| 2010/0309100 A1 | 12/2010 | Cok et al. | |
| 2011/0279444 A1 | 11/2011 | Chung et al. | |
| 2011/0298820 A1 | 12/2011 | Hajjar | |
| 2012/0086734 A1 | 4/2012 | Kitani et al. | |
| 2012/0113083 A1 | 5/2012 | Kim et al. | |
| 2012/0169777 A1 | 7/2012 | Budni et al. | |
| 2013/0009938 A1* | 1/2013 | Hwang | G09G 3/348 345/212 |
| 2014/0362062 A1 | 12/2014 | Limketkai et al. | |
| 2016/0139416 A1 | 5/2016 | Yamakawa et al. | |
| 2017/0263183 A1 | 9/2017 | Lin et al. | |
| 2018/0151132 A1 | 5/2018 | Lee et al. | |
| 2018/0182279 A1 | 6/2018 | Sakariya et al. | |
| 2018/0301080 A1* | 10/2018 | Shigeta | G09G 3/2014 |
| 2019/0304386 A1* | 10/2019 | Kim | H01L 27/1214 |
| 2019/0371231 A1* | 12/2019 | Kim | G09G 3/2011 |
| 2019/0371232 A1* | 12/2019 | Kim | H01L 25/0753 |

FOREIGN PATENT DOCUMENTS

| | | |
|---|---|---|
| KR | 10-0638723 B1 | 10/2006 |
| KR | 10-0758987 B1 | 9/2007 |
| KR | 10-0914929 B1 | 9/2009 |
| KR | 10-2015-0015637 A | 2/2015 |
| KR | 10-2018-0002786 A | 1/2018 |
| WO | 2018053025 A1 | 3/2018 |

OTHER PUBLICATIONS

Written Opinion (PCT/ISA/237) dated May 17, 2019 issued by the International Searching Authority in International Application No. PCT/KR2019/001359.
International Search Report (PCT/ISA/210) dated Jul. 3, 2019 issued by the International Searching Authority in International Application No. PCT/KR2019/001343.
Written Opinion (PCT/ISA/237) dated Jul. 3, 2019 issued by the International Searching Authority in International Application No. PCT/KR2019/001343.
International Search Report (PCT/ISA/210) dated Jul. 3, 2019 issued by the International Searching Authority in International Application No. PCT/KR2019/001357.
Written Opinion (PCT/ISA/237) dated Jul. 3, 2019 issued by the International Searching Authority in International Application No. PCT/KR2019/001357.
Communication dated Apr. 27, 2020 issued by the United States Intellectual Property Office in counterpart U.S. Appl. No. 16/263,901.
Communication dated Mar. 4, 2020 issued by the United States Intellectual Property Office in counterpart U.S. Appl. No. 16/263,253.

* cited by examiner

DISPLAY PANEL AND METHOD FOR DRIVING THE DISPLAY PANEL

CROSS-REFERENCE TO RELATED APPLICATION

This application is based on and claims priority under 35 U.S.C. § 119(a) of a Korean Patent Application number 10-2018-0118310, filed on Oct. 4, 2018, in the Korean Intellectual Property Office, and the disclosure of which is incorporated by reference herein in its entirety.

BACKGROUND

1. Field

The disclosure relates to a display panel and a method for driving the display panel. More particularly, the disclosure relates to a display panel in which light emitting devices are included in a pixel, and a method for driving the display panel.

2. Description of Related Art

In related art, a display panel driving an inorganic light emitting device (hereinafter referred to as "LED") such as a red LED, a green LED, and a blue LED, as a sub pixel expresses a grayscale or gradation of a sub pixel through a pulse amplitude modulation (PAM) drive method.

In this case, a wavelength as well as a grayscale or gradation of a light emitted is shifted together according to amplitude of the driving current, and thereby a color reproducibility of an image is reduced. FIG. 1 illustrates wavelength shifts according to a magnitude or an amplitude) of a driving current flowing through a blue LED, a green LED, and a red LED.

The above information is presented as background information only to assist with an understanding of the disclosure. No determination has been made, and no assertion is made as to whether any of the above description may be applicable as prior art with regard to the disclosure.

SUMMARY

Aspects of the disclosure are to address at least the above-mentioned problems and/or disadvantages and to provide at least the advantages described below. Accordingly, an aspect of the disclosure is to provide a display panel providing improved color reproducibility to an input image signal through an LED which is an inorganic light emitting device mounted on a glass substrate, and a method for driving the display panel.

Another aspect of the disclosure is to provide a display panel including a driving circuit capable of more efficiently driving an LED which is an inorganic light emitting device mounted on a glass substrate, and a method for driving the display panel.

Another aspect of the disclosure is to provide a display panel including a driving circuit appropriate for a high-density integrated circuit by optimizing a design of a driving circuit driving an LED which is an inorganic light emitting device mounted on a glass substrate, and a method for driving the display panel.

Another aspect of the disclosure is to provide a display panel including a driving circuit capable of stably operating an LED which is an inorganic light emitting device mounted on a glass substrate, and a method for driving the display panel.

According to an embodiment of the disclosure, a display panel is provided. In the display panel, a plurality of pixels respectively including a plurality of sub pixels are arranged in a matrix form on a glass. Each of the plurality of sub pixels includes a driving circuit disposed on the glass and configured to receive a pulse amplitude modulation (PAM) data voltage and a pulse width modulation (PWM) data voltage, and an inorganic light emitting device mounted on the driving circuit and configured to be electrically connected to the driving circuit, and to emit a light based on a driving current provided from the driving circuit. The PAM data voltage is applied at once to the plurality of pixels included in the display panel. The driving circuit is configured to control a grayscale of a light emitted by the inorganic light emitting device by controlling a pulse width of a driving current having an amplitude corresponding to the applied PAM data voltage based on the applied PWM data voltage.

The driving circuit may include a PAM driving circuit including a first driving transistor, and configured to control amplitude of the driving current based on the applied PAM data voltage, and a PWM driving circuit including a second driving transistor and configured to control a pulse width of the driving current based on the applied PWM data voltage.

The PAM driving circuit may be configured to, based on the PAM data voltage being applied, apply a first voltage based on a threshold voltage of the first driving transistor and the applied PAM data voltage to a gate terminal of the first driving transistor. The PWM driving circuit may be configured to, based on the PWM data voltage being applied, apply a second voltage based on a threshold voltage of the second driving transistor and the applied PWM data voltage to a gate terminal of the second driving transistor.

The driving circuit may be configured to, based on a driving voltage driving the driving circuit being applied to the inorganic light emitting device through the first driving transistor and a linearly-shifting sweep signal being applied to the PWM driving circuit, provide a driving current of amplitude corresponding to the applied PAM data voltage to the inorganic light emitting device from a time when the driving voltage is applied to the inorganic light emitting device until a time when the second voltage applied to the gate terminal of the second driving transistor is linearly shifted according to the sweep signal and becomes the threshold voltage of the second driving transistor.

The PWM data voltage may be sequentially applied to the plurality of pixels for each line of the plurality of pixels arranged in the matrix form.

The PAM data voltage applied at once to the plurality of pixels may be a voltage of the same magnitude.

The display panel may be divided into a plurality of areas. The PAM driving circuit may receive the PAM data voltage for each of the plurality of areas.

A PAM data voltage applied to at least one area for driving a high dynamic range (HDR) from among the plurality of areas may be different from a PAM data voltage applied to other areas of the plurality of areas.

The plurality of sub pixels may include an R sub pixel including an inorganic light emitting device emitting a red (R) light, a G sub pixel including an inorganic light emitting device emitting a green (G) light, and a B sub pixel including an inorganic light emitting device emitting a blue (B) light.

The inorganic light emitting device may be a micro-LED of a magnitude less than or equal to 100 micrometers.

The PAM driving circuit may include a first transistor which is connected to in between a drain terminal of the first driving transistor and a gate terminal of the first driving transistor, and a second transistor including a drain terminal connected to a source terminal of the first driving transistor, and a gate terminal connected to a gate terminal of the first transistor.

The PAM driving circuit may be configured to, while the first and second transistors are turned on, based on the PAM data voltage being applied to a source terminal of the second transistor, apply the first voltage corresponding to a sum of the applied PAM data voltage and the threshold voltage of the first driving transistor to the gate terminal of the first driving transistor via a turned-on first driving transistor.

The PWM driving circuit may include a third transistor which is connected to in between a drain terminal of the second driving transistor and a gate terminal of the second driving transistor, and a fourth transistor including a drain terminal connected to a source terminal of the second driving transistor, and a gate terminal connected to a gate terminal of the third transistor.

The PWM driving circuit may be configured to, while the third and fourth transistors are turned on, based on the PWM data voltage being applied via a source terminal of the fourth transistor, apply the second voltage corresponding to a sum of the applied PWM data voltage and the threshold voltage of the second driving transistor to the gate terminal of the second driving transistor via a turned-on second driving transistor.

The driving circuit may further include a fifth transistor including a source terminal connected to a driving voltage terminal of the driving circuit, and a drain terminal commonly connected to a drain terminal of the fourth transistor and a source terminal of the second driving transistor, a sixth transistor including a source terminal connected to a drain terminal of the second driving transistor, a drain terminal connected to the gate terminal of the first driving transistor, a seventh transistor including a source terminal connected to the source terminal of the second driving transistor, and commonly connected to the drain terminal of the fourth transistor and the drain terminal of the fifth transistor, and a drain terminal commonly connected to a source terminal of the first driving transistor and the drain terminal of the second transistor, an eighth transistor including a source terminal connected to the drain terminal of the first driving transistor, and a drain terminal connected to an anode terminal of the inorganic light emitting device, and a first capacitor including a first terminal commonly connected to the gate terminal of the second driving transistor and a drain terminal of the third transistor, and a second terminal receiving a linearly-shifting sweep signal. A cathode terminal of the inorganic light emitting device may be connected to a ground voltage terminal of the driving circuit.

The driving circuit may be configured to drive the PAM driving circuit and the PWM driving circuit independently of each other while the fifth to eighth transistors are turned off, and apply the first voltage and the second voltage to the gate terminal of the first driving transistor and the gate terminal of the second driving transistor, respectively, and based on the sweep signal being applied, to drive the PAM driving circuit and the PWM driving circuit together, and until the second voltage applied to the gate terminal of the second driving transistor is shifted according to the sweep signal and becomes the threshold voltage of the second driving transistor, to provide a driving current having an amplitude corresponding to the applied PAM data voltage to the inorganic light emitting device.

The driving circuit may further include a ninth transistor including a drain terminal commonly connected to the gate terminal of the first driving transistor and the drain terminal of the first transistor, and a source terminal receiving an initial voltage, a tenth transistor including a source terminal connected to the first terminal of the first capacitor, and a drain terminal connected to the source terminal of the ninth transistor, and a second capacitor including a first terminal connected to the driving voltage terminal, and a second terminal commonly connected to the gate terminal of the first driving transistor, the drain terminal of the first transistor, the drain terminal of the ninth transistor, and the drain terminal of the sixth transistor.

The driving circuit may be configured to, based on the ninth transistor and the tenth transistor being turned on, initialize gate terminal voltages of the first and second driving transistors by applying the initial voltage to the gate terminal of the first driving transistor and the gate terminal of the second driving transistor, and, to prevent a driving voltage from being coupled to the gate terminal of the first driving transistor via the second capacitor after the gate terminal voltages of the first and second driving transistors are initialized, to apply the initial voltage to the gate terminals of the first and second driving transistors via the turned-on ninth and tenth transistors even after the driving voltage is applied to the first terminal of the second capacitor.

The driving circuit may further include an eleventh transistor connected to in between the anode terminal of the inorganic light emitting device and the cathode terminal of the inorganic light emitting device.

The eleventh transistor may be configured to, before the inorganic light emitting device is mounted on the driving circuit, be turned on to check whether the driving circuit is abnormal, and after the inorganic light emitting device is mounted on the driving circuit, to be turned on to discharge an electric charge remaining in the inorganic light emitting device.

According to an embodiment of the disclosure, a method for driving a display panel is provided. In the display panel, a plurality of pixels respectively including a plurality of sub pixels are arranged in a matrix form on a glass. Each of the plurality of sub pixels includes a driving circuit formed on the glass and configured to receive a pulse amplitude modulation (PAM) data voltage and a pulse width modulation (PWM) data voltage, and an inorganic light emitting device mounted on the driving circuit and configured to be electrically connected to the driving circuit, and to emit a light based on a driving current provided from the driving circuit. The driving circuit includes a PAM driving circuit including a first driving transistor and configured to control amplitude of the driving current based on the applied PAM data voltage, and a PWM driving circuit including a second driving transistor and configured to control a pulse width of the driving current based on the applied PWM data voltage. The method includes, based on the PAM data voltage being applied to the PAM driving circuit, compensating the applied PAM data voltage to the threshold voltage of the first driving transistor, and based on the PWM data voltage being applied to the PWM driving circuit, compensating the applied PWM data voltage to the threshold voltage of the second driving transistor, and based on the compensated PWM data voltage and the compensated PAM data voltage, providing, to the inorganic light emitting device, a driving current having an amplitude corresponding to the applied PAM data voltage and a pulse width corresponding to the applied PWM data voltage. The PAM data voltage is applied at once to the plurality of pixels included in the display panel.

According to the various example embodiments, a wavelength shift of a light emitted from an inorganic light emitting device included in a display panel according to a grayscale or gradation can be prevented.

In addition, it is possible to correct a stain or color of the light emitting device included in the display panel, and even in a case that a large-area tiled display panel is configured by combining a display panel in the form of a plurality of modules, a difference of brightness or color among the respective modular display panels can be corrected.

Further, a more optimized driving circuit design is enabled so that the inorganic light emitting device can be driven more stably and efficiently, thereby contributing to a miniaturization and lightening of a display panel.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, and advantages of certain embodiments of the disclosure will be more apparent from the following description taken in conjunction with the accompanying drawings, in which.

The same reference numerals are used to represent the same elements throughout the drawings.

DETAILED DESCRIPTION

In the following description, well-known functions or constructions are not described in detail since they would obscure the application with unnecessary detail. In addition, the overlapped description of the same element is omitted as much as possible.

The term "unit" is provided or mixed up in use for the ease of preparing the present specification, which does not itself have a distinct meaning or serve a purpose.

The terms used in the following description are provided to explain example embodiments and are not intended to limit the scope. It is to be understood that the singular forms "a," "an," and "the" include plural referents unless the context clearly dictates otherwise.

Throughout this specification, it will be understood that the term "comprise" and variations thereof, such as "comprising" and "comprises", specify the presence of features, numbers, steps, operations, components, parts, or combinations thereof, described in the specification, but do not preclude the presence or addition of one or more other features, numbers, steps, operations, components, parts, or combinations thereof.

In the description, the terms "first, second, and so forth" are used to describe diverse elements regardless of their order and/or importance and to discriminate one element from other elements, but are not limited to the corresponding elements.

If it is described that a certain element (for example, first element) is "operatively or communicatively coupled with/to" or is "connected to" another element (for example, second element), it should be understood that the certain element may be connected to the other element directly or through still another element (for example, third element). To the contrary, it will be understood that when an element (for example, a first element) is "directly coupled with/to" or "directly connected to" another element (for example, a second element), there is no intervening element (for example, a third element) between the element and another element. Meanwhile, when it is mentioned that one element (for example, first element) is "directly coupled" with or "directly connected to" another element (for example, second element), it may be understood that there is no element (for example, third element) present between one element and another element.

Unless indicated otherwise, it is to be understood that all the terms used in the disclosure including technical and scientific terms has the same meaning as those that are understood by those who skilled in the art.

Hereinafter, the present disclosure will be described in detail with reference to the accompanying drawings.

Figure 1:
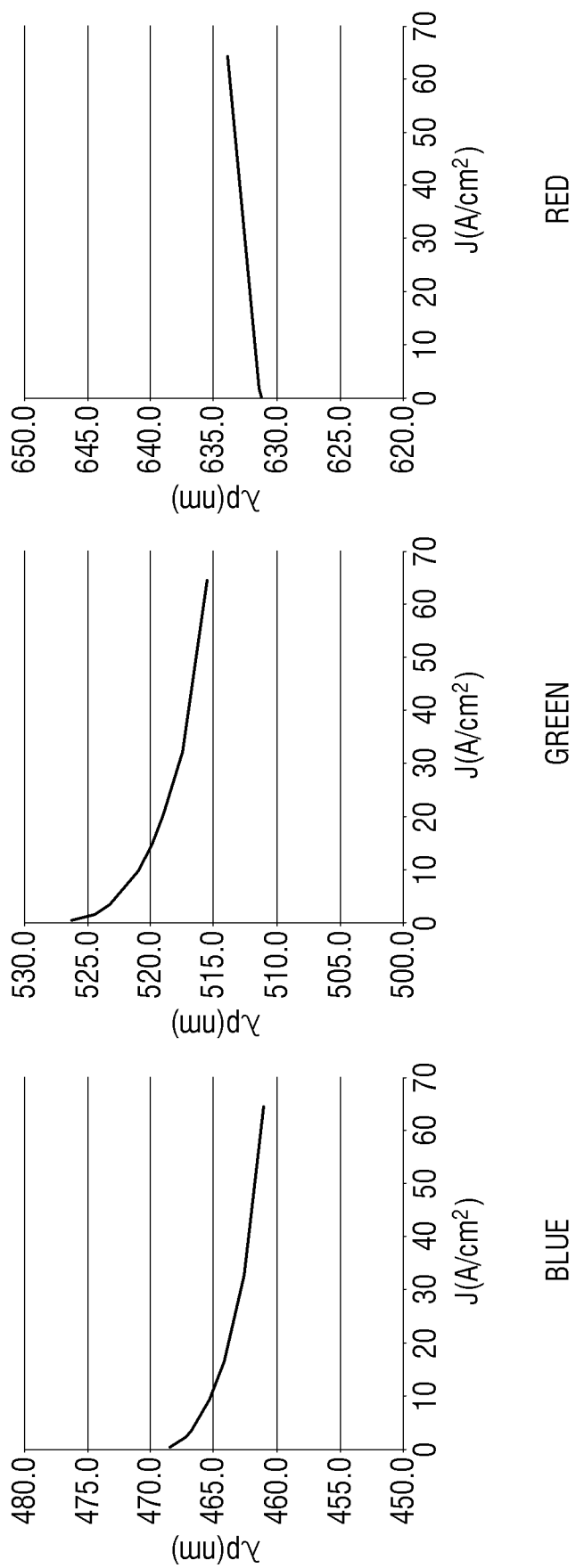
FIG. 1 is a diagram illustrating a wavelength shift according to a magnitude of a driving current flowing through a blue LED, a green LED, and a red LED.
Figure 2A:
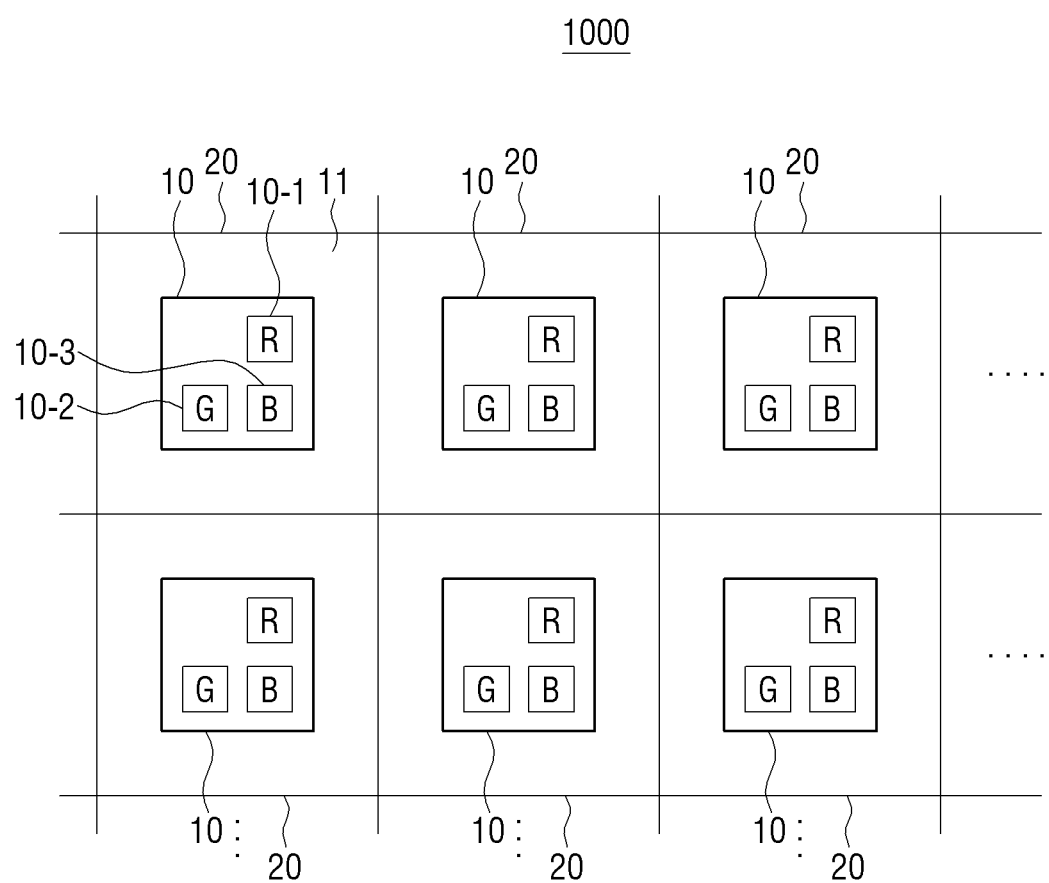
FIG. 2A is a diagram illustrating a pixel structure of a display panel, according to an example embodiment.

FIG. 2A is a diagram illustrating a pixel structure of a display panel 1000, according to an example embodiment. As illustrated in FIG. 2A, the display panel 1000 may include a plurality of pixels 10 which are arranged in a matrix form.

The respective pixels 10 may include a plurality of sub-pixels 10-1, 10-2 and 10-3. For example, one pixel 10 included in the display panel 1000 may include three types of sub-pixels: a red (R) sub-pixel 10-1, a green (G) sub-pixel 10-2, and a blue (B) sub-pixel 10-3. That is, one set of R, G and B sub-pixels may constitute a unit pixel of the display panel 1000.

Referring to FIG. 2A, it may be understood that one pixel area 20 of the display panel 1000 may include an area 10 occupied with pixels, and a remaining peripheral area 11.

The area 10 occupied with pixels 10 may include the R, G and B sub-pixels 10-1 to 10-3. The R sub-pixel 10-1 may include an R light emitting device and a driving circuit for driving the R light emitting device. The G sub-pixel 10-2 may include a G light emitting device and a driving circuit for driving the G light emitting device. The B sub-pixel 10-3 may include a B light emitting device and a driving circuit for driving the B light emitting device.

The remaining area 11 peripheral to the pixel 10 may, as will be described with reference to FIGS. 5 and 6, include various circuits for driving the driving circuit according to an example embodiment.

Figure 2B:
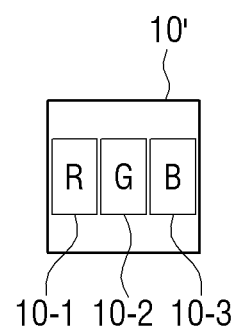
FIG. 2B is a diagram illustrating a sub-pixel structure, according to another example embodiment.

FIG. 2B is a diagram illustrating a sub-pixel structure, according to another example embodiment. Referring to FIG. 2A, it may be understood that the sub-pixels 10-1 to 10-3 in the one pixel 10 are arranged in an L shape of which the left and right side are switched. However, the example is not limited thereto, and as illustrated in FIG. 2B, the R, G and B sub-pixels 10-1 to 10-3 may be arranged in a row inside a pixel 10'. However, the disposition form of the sub-pixels is only an example, and a plurality of sub-pixels are disposed in various forms inside the respective pixels according to example embodiments.

In the example described above, a pixel includes three types of sub-pixels, but is not limited thereto. For example, a pixel may be implemented of four types such as R, G, B and white (W), and according to an example embodiment, a different number of pixels may be included in one pixel. Hereinafter, an example in which the pixel 10 includes three types of sub-pixels such as R, G and B will be described for convenience of explanation.

Figure 3:
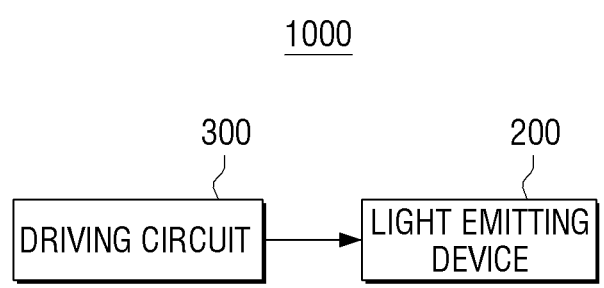
FIG. 3 is a block diagram illustrating a configuration of a display panel, according to an example embodiment.

FIG. 3 is a block diagram illustrating a configuration of a display panel, according to an example embodiment. Referring to FIG. 3, the display panel 1000 may include a driving circuit 300 and a light emitting device 200. The display panel 1000 may include a driving circuit 300 disposed on a glass, and a light emitting device 200 disposed on the driving circuit 300 as will be described later.

For example, the light emitting device 200 may be mounted on the driving circuit 300 so that the light emitting device 200 is electrically connected to the driving circuit 300, and may emit light on the basis of a driving current provided from the driving circuit 300.

The light emission device 200 may be included in the sub-pixels 10-1 to 10-3 of the display panel 1000, and may be of a plurality of types according to a color of light. For example, the light emitting device 200 may include a red (R) light emitting device emitting light in red color, a green (G) light emitting device emitting light in green light, and a blue (B) light emitting device emitting light in blue color.

Accordingly, a type of sub-pixel may be determined according to a type of the light emitting device 200 included in the sub-pixel. That is, the R light emitting device may be included in the R sub-pixel 10-1. The G light emitting device may be included in the G sub-pixel 10-2. The B light emitting device may be included in the B sub-pixel 10-3.

The light emitting device 200 may be an inorganic light emitting device (or inorganic light emitting diode) by means of an inorganic material which is different from an organic light emitting device (or organic light emitting diode, OLED) fabricated using an organic material. Hereinafter, the LED refers to an inorganic light emitting device which is distinguished from the OLED.

According to an example embodiment, the light emitting device 200 may be a micro light emitting diode (micro-LED). The micro LED refers to a subminiature inorganic light emitting device having a size of less than or equal to 100 micrometers (μm) self-illuminating without a backlight or a color filter.

In addition, the light emitting device 200 may emit light according to a driving current provided by the driving circuit 300. For example, the light emitting device 200 may emit light with different brightnesses according to an amplitude or a pulse width of a driving current provided from the driving circuit 300. Here, the pulse width of the driving current may be expressed as a duty ratio of the driving current or a driving time of the driving current.

For example, the light emitting device 200 may emit light of a higher brightness with the increase in the amplitude of the driving current and with the increase in the pulse width (that is, with the increase in the duty ratio or with the increase in the driving time). However, the example is not limited thereto.

The driving circuit 300 may drive the light emitting device 200. For example, the driving circuit 300 may pulse amplitude modulation (PAM) drive or pulse width modulation (PWM) drive the light emitting device 200 to control a grayscale or gradation of a light emitted by the light emitting device 200.

That is, the driving circuit 300 may, for example, receive application of a PAM data voltage and a PWM data voltage from a data driver (not illustrated) and control amplitude and pulse width of a driving current driving the light emitting device 200 together, and provide the driving current of which amplitude and pulse width are controlled together to the light emitting device 200, and drive the light emitting device 200.

Here, the amplitude and the pulse width of the driving current being controlled "together" does not mean that the driving circuit 300 controls the amplitude and the pulse width of the driving current simultaneously in time, but means that the PAM drive method and the PWM drive method are employed together to express a grayscale or gradation.

The driving circuit 300 may control a pulse width of a driving current having an amplitude corresponding to the applied PAM data voltage on the basis of the applied PWM data voltage.

According to an example embodiment, the PAM data voltage may be applied at once to all pixels (or all sub pixels) included in the display panel 1000. A specific description regarding this operation will be explained below.

According to an example embodiment, the driving circuit 300 may drive the light emitting device 200 and express a grayscale or gradation by the sub pixel. As described above, the display panel 1000 may include sub-pixels by the light emitting device 200, and thus, unlike a liquid crystal display (LCD) panel using a plurality of LEDs emitting light in a single color as a backlight, the driving circuit 300 may drive the light emitting device 200 and differently expresses a grayscale or gradation by the sub-pixel.

To this end, the respective sub-pixels included in the display panel 1000 may include the light emitting device 200 and a driving circuit 300 for driving the corresponding light emitting device 200. That is, the driving circuit 300 for driving the respective device 200 may be present for each sub-pixel.

The PWM drive method is a method of expressing a grayscale or gradation according to a duration of light emission of the light emitting device 200. Accordingly, in a case that the light emitting device 200 is driven using the PWM method, even if the driving current has the same amplitude, it is possible to express various grayscales or gradations by adjusting the pulse width of the driving current and controlling the duration of light emission of the light emitting device 200. Accordingly, it is possible to solve the problem of, in a case that an LED is driven using the PAM method alone, a wavelength shift of light emitted by an LED (in particular, micro-LED) that may occur according to a grayscale or gradation.

To this end, the driving circuit 300 may include a PAM driving circuit and a PWM driving circuit for each sub pixel, and this will be described in greater detail below.

Figure 4:
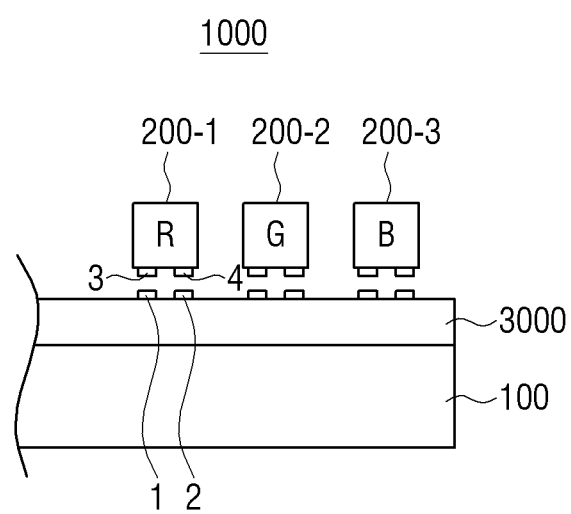
FIG. 4 is a cross-sectional view of a display panel, according to an example embodiment.

FIG. 4 is a cross-sectional view of a display panel 1000, according to an example embodiment. With reference to FIG. 4, only one pixel included in the display panel 1000 is described for convenience of explanation.

Referring to FIG. 4, the display panel 1000 may include a glass 100, a thin film transistor (TFT) layer 3000, and light emitting devices R, G and B 200-1, 200-2 and 200-3. The driving circuit 300 (not illustrated) may be implemented as a thin film transistor (TFT) and included in the TFT layer 3000 disposed on the glass 100. The respective light emitting devices R, G and B 200-1 to 200-3 may be arranged on the TFT layer 3000 and included in the respective sub pixels 10-1 to 10-3 of the display panel 1000.

As described above, the display panel 1000 in which the TFT layer 3000 and the light emitting devices 200-1 to 200-3 are disposed on the glass 100 may be referred to as a display panel of a chip on glass (COG) type. The display panel of the COG type is different from a display panel of a chip on board (COB) type in which a TFT layer and a light emitting device layer are disposed on a substrate such as a synthetic resin and the like.

In this case, the TFT layer 3000 may be a low temperature poly silicon (LTPS) TFT, but is not limited thereto. Meanwhile, the TFT layer 3000 disposed on the glass 100 and the glass 100 may be added together and referred to as a TFT panel or a glass substrate. A type or characteristic of the glass 100 included in the glass substrate is not related to the example embodiments so that an explanation thereof is omitted.

Although not expressly illustrated in the drawings, the driving circuit 300 for driving the respective light emitting devices 200-1 to 200-3 may be present on the TFT layer 3000 for each of the light emitting devices 200-1 to 200-3. The light emitting devices R, G and B 200-1 to 200-3 may be arranged on the TFT layer 3000 so that they are respectively electrically connected to the corresponding driving circuit 300.

For example, as illustrated in FIG. 4, the R light emitting device 200-1 may be mounted or arranged so that an anode electrode 3 and a cathode electrode 4 of the R light emitting device 200-1 are respectively connected to an anode electrode 1 and a cathode electrode 2 disposed on the driving circuit 300 (not illustrated) for driving the R light emitting device 200-1, and the same applies to the G light emitting device 200-2 and the B light emitting device 200-3. According to an example embodiment, any one of the anode electrode 1 and the cathode electrode 2 may be implemented as a common electrode.

With reference to FIG. 4, an example in which the light emitting device 200-1 to 200-3 is a micro-LED of a flip chip type is described. However, the example is not limited thereto, and according to an example embodiment, the light emitting device 200-1 to 200-3 may be a micro-LED of a lateral type or a micro-LED of a vertical type.

According to an example embodiment, the display panel 1000 may further include a multiplexer (MUX) circuit for selecting any one of the plurality of sub pixels 10-1 to 10-3 included in the pixel 10, an electro static discharge (ESD) circuit for preventing a static electricity occurring on the display panel 1000, a power circuit for supplying power to the driving circuit 300, a clock provision circuit for providing a clock driving the driving circuit 300, at least one gate driver for driving pixels of the display panel 1000 arranged in a matrix form by the horizontal line (or by the row), a data driver (or a source driver) for providing a data voltage (for example, a PAM data voltage, a PWM data voltage, or the like) to the respective pixels or to the respective sub-pixels, and the like.

An example display panel further comprising these various circuits will be described in greater detail below with reference to FIGS. 5 and 6. In FIGS. 5 and 6, the same elements described above will not be described in detail.

Figure 5:
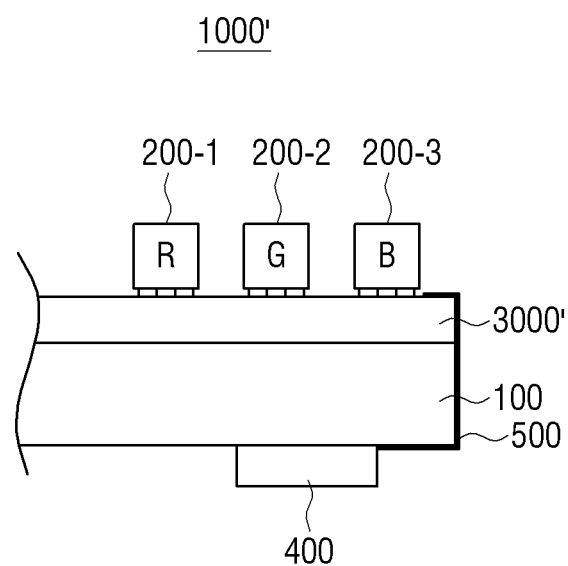
FIG. 5 is a cross-sectional view of a display panel, according to another example embodiment.

FIG. 5 is a cross-sectional view of a display panel 1000', according to an example embodiment. As illustrated in FIG. 5, the display panel 1000' may include a TFT layer 3000' including a driving circuit 300 (not illustrated) disposed on the glass 100, a light emitting device 200-1 to 200-3 disposed on the TFT layer 3000' and respectively included in a sub pixel of the display panel 1000', the various circuits 400 for driving the driving circuit 300, and a connection cable 500 electrically connecting the TFT layer 3000' with the various circuits 400.

The TFT layer 3000' may include a driving circuit 300 implemented as TFTs, and may be formed on a first surface of the glass 100.

The various circuits 400 may include a MUX circuit for operation of the driving circuit 300, an electro static discharge (ESD) circuit, a power circuit, a clock provision circuit, a gate driver, a data driver, and etc., and may be disposed or arranged on a second surface of the glass 100.

According to an example embodiment, the display panel 1000' may include the connection cable 500 disposed in an edge area of a TFT substrate, and electrically connecting the TFT layer 3000' disposed on a first surface of the glass 100 with the various circuits 400 disposed on a second surface of the glass 100.

The connection cable 500 is disposed in the edge area of the TFT substrate because otherwise, a crack may occur on the glass due to a difference of temperature between a fabrication process of a TFT substrate and a process of filling a hole with conductive materials, where a hole penetrating the glass 100 is disposed and circuits arranged on the opposite sides of the glass 100 are connected to each other, In the example described above, all circuits for operation of the driving circuit 300 are, as in the reference numeral 400, separately disposed on the opposite side of the glass 100 surface on which the TFT layer 3000' is disposed. However, the example is not limited thereto. That is, all or some of the various circuits described above may be disposed on the TFT layer 3000'.

For example, all the various circuits described above may be disposed on the TFT layer 3000'. In this case, it is not necessary that a circuit is additionally arranged on the other surface of the glass 100 and accordingly, the connection cable 500 of FIG. 5 connecting front and rear surfaces of the glass 100 would not be necessary, either.

As another example, the MUX circuit, the ESD circuit, the power circuit, the clock provision circuit, and the gate driver may be implemented as TFTs and included in the TFT layer 3000', and the display panel may be implemented in such a way that the data driver circuit is additionally arranged on the other side of the glass 100. FIG. 6 is a diagram provided to explain such an example embodiment.

Figure 6:
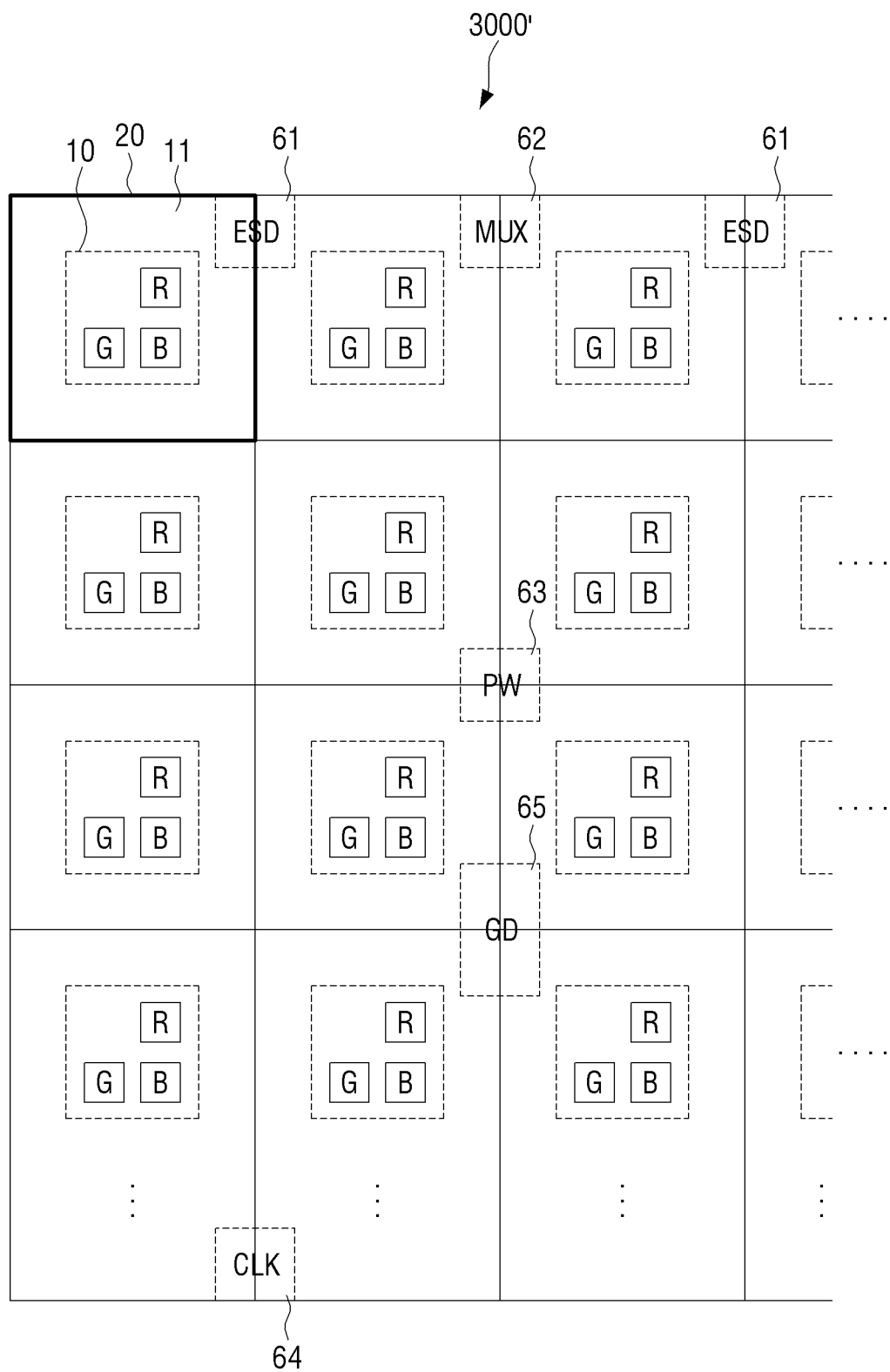
FIG. 6 is a plane view illustrating a thin film transistor (TFT) layer, according to an example embodiment.

FIG. 6 is a cross-sectional view of a TFT layer 3000', according to an example embodiment. In detail, FIG. 6 illustrates a disposition of various circuits included in the TFT layer 3000' of the display panel 1000'.

Referring to FIG. 6, an entire pixel area 20 occupied by (or corresponding to) one pixel in the TFT layer 3000' may include an area 10 in which various driving circuits 300 for driving the R, G and B sub pixels are arranged, and a peripheral remaining area 11.

According to an example embodiment, a size of the area 10 occupied by a driving circuit 300 for the respective R, G and B sub pixels may be, for example, a size of about a quarter of the entire pixel area 20, but is not limited thereto.

As described above, one pixel area 20 may include the remaining area 11 in addition to the area 10 occupied by the driving circuit 300 for driving the respective sub pixels, and so may the other pixels.

That is, according to an example embodiment, many spaces other than an area occupied with the driving circuit 300 are present in the TFT layer 3000', and thus, the ESD circuit 61, the MUX circuit 62, the power circuit 63, the clock provision circuit 64, and the gate driver circuit 65 may be implemented as TFTs and included in the remaining area 11 of the TFT layer 3000' as illustrated in FIG. 6. In this case, the data driver circuit may be arranged on the other surface of the glass 100 as in the reference numeral 400 of FIG. 5.

Meanwhile, the location, size and number of the respective ESD circuit 61, the MUX circuit 62, the power circuit 63, the clock provision circuit 64, and the gate driver circuit 65 is only a non-limiting example.

In addition, an example embodiment in which various circuits are arranged on both sides as being divided based on the glass 100 is not limited to the example illustrated in FIG. 6, and at least one circuit from among the ESD circuit 61, the MUX circuit 62, the power circuit 63, the clock provision circuit 64, and the gate driver circuit 65 of FIG. 6 may be arranged on the other surface of the glass 100 as in the reference numeral 400.

A constitution and operation of the driving circuit 300 according to various example embodiments will not be described in detail with reference to FIGS. 7A, 7B, 8, 9, 10, 11A and 11B.

Figure 7A:
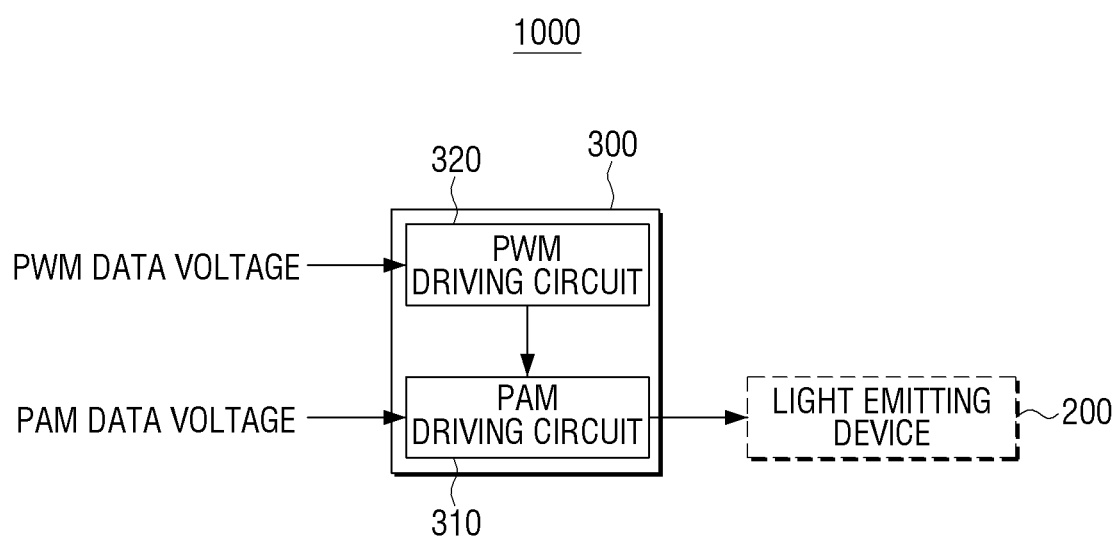
FIG. 7A is a block diagram and circuit diagram related to one sub pixel, according to an example embodiment.
Figure 7B:
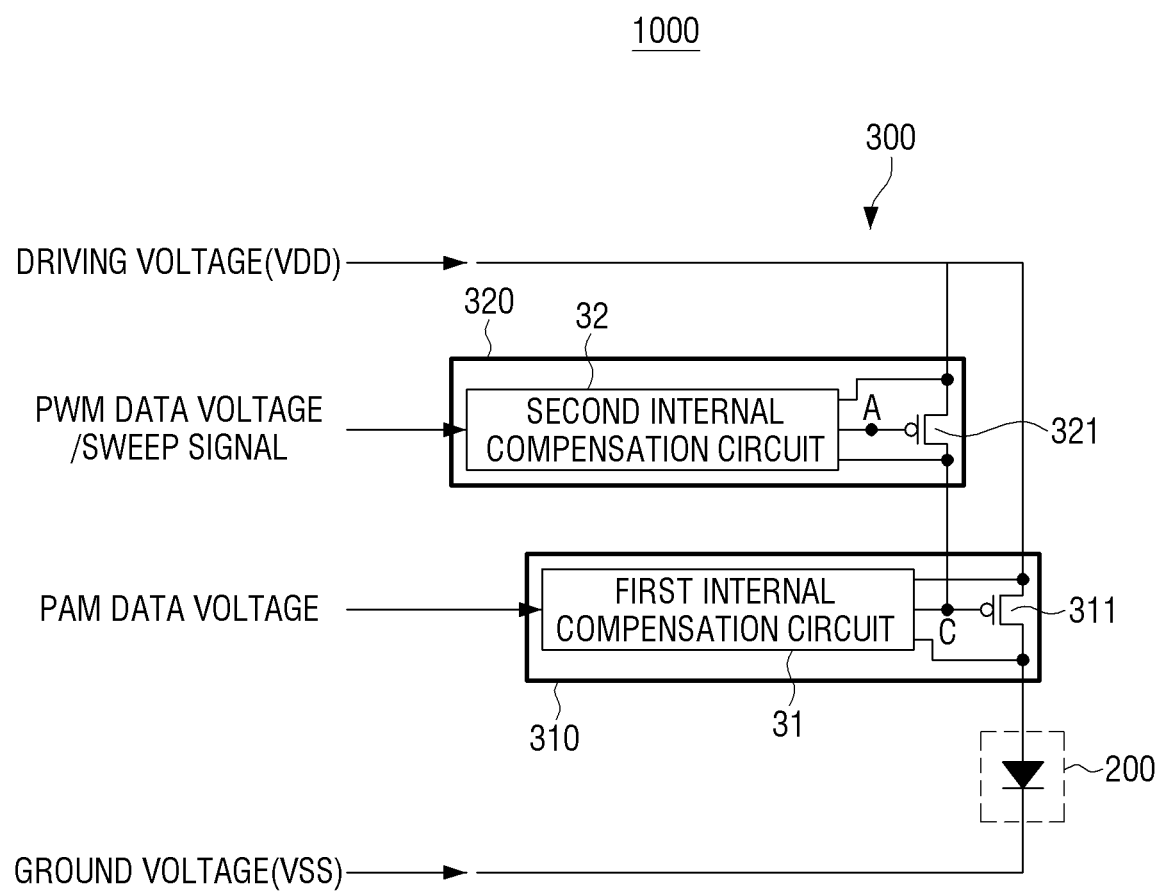
FIG. 7B is a block diagram and circuit diagram related to one sub pixel, according to an example embodiment.

FIGS. 7A and 7B are respectively a block diagram and a circuit diagram related to one sub pixel, according to an example embodiment. That is, FIGS. 7A and 7B illustrate only one light emitting device 200, and a driving circuit 300 for driving the one light emitting device 200. Accordingly, the light emitting device 200 and the driving circuit 300 as illustrated in FIGS. 7A and 7B may be provided in the display panel 1000 and 1000' by the sub pixel. Meanwhile, the light emitting device 200 may be a micro-LED in any one color from among R, G and B.

As described above, the driving circuit 300 may receive application of a PAM data voltage and a PWM data voltage, and control an amplitude and a pulse width of a driving current driving the light emitting device 200. To this end, the driving circuit 300 may include a PAM driving circuit 310 and a PWM driving circuit 320 as illustrated in FIG. 7A.

The driving circuit 300 may be provided for each sub pixel, and one driving circuit 300 drives one sub pixel and thus may be referred to as a pixel circuit depending on circumstances. In this case, the PAM driving circuit 310 may be referred to as a PAM pixel circuit, and the PWM driving circuit 320 may be referred to as a PWM pixel circuit. For convenience of explanation, the terms "driving circuit" "PWM driving circuit" and "PWM driving circuit 320" are used to describe an example embodiment.

The PAM driving circuit 310 may control an amplitude of a driving current provided to the light emitting device 200 on the basis of the applied PAM data voltage. The PWM driving circuit 320 may control a pulse width of the driving current provided to the light emitting device 200 on the basis of the applied PWM data voltage.

The PAM driving circuit 310 may provide a driving current having an amplitude corresponding to the PAM data voltage to the light emitting device 200. In this case, the PWM driving circuit 320 may control a duration of a driving current (that is, a driving current of amplitude corresponding to the PAM data voltage) provided to the light emitting device 200 by the PAM driving current on the basis of the PWM data voltage, and thereby a pulse width of the driving current can be controlled.

The light emitting device 200 may emit light according to a driving current provided by the driving circuit 300. For example, the light emitting device 200 may emit light with different brightnesses according to an amplitude or a pulse width of a driving current provided from the driving circuit 300. Here, the pulse width of the driving current may be expressed as a duty ratio of the driving current or a driving time of the driving current.

For example, the light emitting device 200 may emit light having a higher brightness with the increase in the amplitude of the driving current and with the increase in the pulse width (that is, with the increase in the duty ratio or with the increase in the driving time). However, the example is not limited thereto.

FIG. 7B is a block diagram illustrating a driving circuit 300 illustrated in FIG. 7A in more detail. According to an example embodiment, the PAM driving circuit 310 and the PWM driving circuit 320 may include a driving transistor, and an internal compensation circuit for compensating a threshold voltage of the driving transistor, respectively.

For example, as illustrated in FIG. 7B, the PAM driving circuit 310 may include a first driving transistor 311 and a first internal compensation circuit 31.

The first driving transistor 311 may provide a driving current of different amplitudes to the light emitting device 200 according to a magnitude of voltage applied to a gate terminal C. For example, the PAM driving circuit 310 may provide a driving current having an amplitude corresponding to the applied PAM data voltage to the light emitting device 200 via the first driving transistor 311.

In this case, a threshold voltage of the first driving transistor 311 may be an issue. For example, a plurality of sub pixels are present in the display panel 1000 and 1000', and the respective sub pixels may include the corresponding first driving transistor 311. Theoretically, a transistor fabricated under the same condition has the same threshold voltage. However, actual transistors may have different threshold voltages even if they are fabricated under the same condition, and so may the first driving transistors 311 included in the display panel 1000 and 1000'.

As described above, in a case that the first driving transistors 311 corresponding to the respective sub pixels have different threshold voltages, the first driving transistors 311 may apply a driving current of different amplitudes corresponding to a difference of threshold voltages to the respective light emitting devices 200 even if the same PAM data voltage is applied to the gate terminal, and this may be displayed as a stain on the image and the like.

Accordingly, it is necessary to compensate a deviation of threshold voltage between the first driving transistors 311 included in the display panel 1000 and 1000'.

The first internal compensation circuit 31 is configured to compensate a threshold voltage of the first driving transistor 311. For example, when a PAM data voltage is applied, the PAM driving circuit 310 may apply a voltage based on the threshold voltage of the first driving transistor 311 and the applied PAM data voltage to the gate terminal C of the first driving transistor 311 via the first internal compensation circuit 31.

Accordingly, the first driving transistor 311 may provide a driving current of amplitude corresponding to a magnitude of the applied PAM data voltage to the light emitting device 200 regardless of the threshold voltage of the first driving transistor 311.

Accordingly, a problem according to a deviation of threshold voltage between the first driving transistors 311 included in the display panel 1000 and 1000' can be overcome.

Meanwhile, as illustrated in FIG. 7B, the PWM driving circuit 320 may include a second driving transistor 321 and a second internal compensation circuit 32 as well.

The second driving transistor 321 may be connected to the gate terminal C of the first driving transistor 311, and control a gate terminal voltage of the first driving transistor 311, thereby controlling a pulse width of a driving current.

For example, after the light emitting device 200 starts light emission according to a driving current provided by the first driving transistor 311, when a duration corresponding to a PWM data voltage has elapsed, the second driving transistor 321 may turn off the first driving transistor 311 and control a pulse width of the driving current.

Meanwhile, a deviation of threshold voltage is present in the second driving transistors 321 present for each sub pixel of the display panel 1000 and 1000', and if the deviation is not compensated, even if the same PWM data voltage is applied to the second driving transistors 321, a driving current of different pulse widths corresponding to the deviation of threshold voltage is provided to the respective light emitting device 200, which is a problem.

The second internal compensation circuit 32 is configured to compensate a threshold voltage of the second driving transistor 321. For example, when a PWM data voltage is applied, the PWM driving circuit 320 may apply a voltage based on the threshold voltage of the second driving transistor 321 and the applied PWM data voltage to a gate terminal A of the second driving transistor 321 via the second internal compensation circuit 32.

Accordingly, the second driving transistor 321 may provide a driving current of amplitude corresponding to a pulse width of the applied PWM data voltage to the light emitting device 200 regardless of the threshold voltage of the second driving transistor 321.

Meanwhile, the operation of the PWM driving circuit 320 will be described in greater detail below. In a state that a first voltage based on the threshold voltage of the first driving transistor 311 and the PAM data voltage is applied to the gate terminal C of the first driving transistor 311 and a second voltage based on the threshold voltage of the second driving transistor 321 and the PWM data voltage is applied to the gate terminal A of the second driving transistor 321, when a driving voltage (VDD) is applied to the light emitting device 200, the PAM driving circuit 310 may provide a driving current source of amplitude corresponding to the PAM driving voltage to the light emitting device 200, and the light emitting device 200 starts emitting light.

In this case, a sweep signal (linear shift voltage) may be applied to the PWM driving circuit 320, and the second driving transistor 321 in an off state may remain in the off state until a voltage of the gate terminal A is linearly shifted according to the sweep signal and reaches the threshold voltage of the second driving transistor 321.

When the voltage of the gate terminal A of the second driving transistor 321 reaches the threshold voltage of the second driving transistor 321, the second driving transistor 321 may be turned on, and the driving voltage (VDD) applied to the source terminal of the second driving transistor 321 may be accordingly applied to the gate terminal C of the first driving transistor 311 via a drain terminal.

The driving voltage (VDD) is applied to the source terminal of the first driving transistor 311. Thus, when the driving voltage (VDD) is applied to the gate terminal C of the first driving transistor 311, a voltage between the gate terminal and the source terminal of the first driving transistor 311 may exceed the threshold voltage of the first driving transistor 311 and the first driving transistor 311 may be turned off. For reference, a threshold voltage of a PMOSFET has a negative value. When a voltage less than or equal to the threshold voltage is applied to in between the gate terminal and source terminal of the PMOSFET, the PMOSFET is turned off. When a voltage greater than the threshold voltage is applied, the PMOSFET is turned off. When the first driving transistor 311 is turned off, the driving current may no longer flow, and the light emitting device 200 stops light emission.

As described above, the PWM driving circuit 320 may control the voltage of the gate terminal A of the first driving transistor 311 and control a pulse width of the driving current.

An operation of an internal compensation circuit will be described in greater detail below with reference to FIG. 8.

Figure 8:
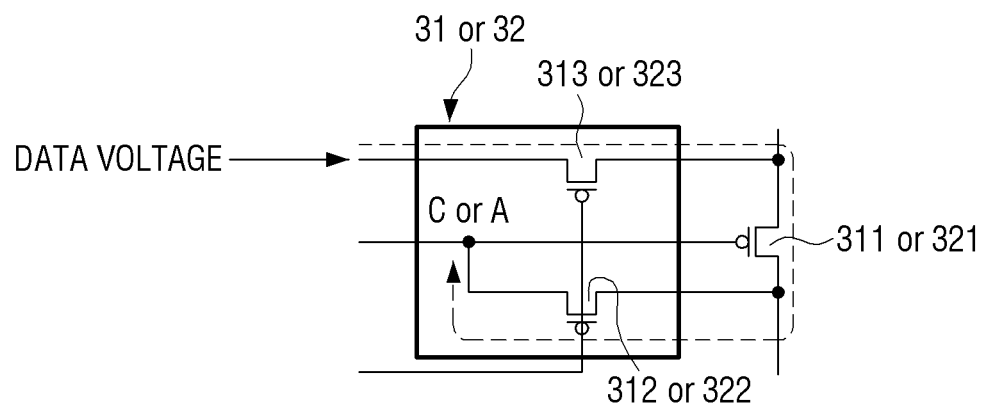
FIG. 8 is a circuit diagram of an internal compensation circuit, according to an example embodiment.

FIG. 8 is a circuit diagram of an internal compensation circuit, according to an example embodiment. As described above, the PAM driving circuit 310 and the PWM driving circuit 320 may respectively include first and second internal compensation circuits 31 and 32 for compensating threshold voltages of the first driving transistor 311 and the second driving transistor 321. The structure and operation of the first internal compensation circuit 31 are similar to the structure and operation of the second internal compensation circuit 32; therefore, an operation of an example first internal compensation circuit 31 will be described below.

The first internal compensation circuit 31 may, when a PAM data voltage is applied, apply a voltage corresponding to the sum of the applied of PAM data voltage and a threshold voltage of the first driving transistor 311 to a gate terminal C of the first driving transistor 311 and compensate the threshold voltage of the first driving transistor 311.

To this end, the first internal compensation circuit 31 may, as illustrated in FIG. 8, include a first transistor 312 connected to and disposed between a gate terminal and a drain terminal of the first driving transistor 311, and a second transistor 313 including a drain terminal connected to a source terminal of the first driving transistor 311 and a gate terminal connected to a gate terminal of the first transistor 312.

For example, when the first and second transistors 312 and 313 are turned on according to a control signal (SPAM) applied to gate terminals of the first and second transistors 312 and 313, the PAM data voltage applied to the source terminal of the first transistor 312 may be input to the first internal compensation circuit 31.

In this case, a voltage of the gate terminal C of the first driving transistor 311 is in a low state (for example, −5V) and thus, the first driving transistor 311 may be fully turned on. Accordingly, the input PAM data voltage is applied to the gate terminal C of the first driving transistor 311 while sequentially going through the first transistor 312, the first driving transistor 311 and the second transistor 313. In this case, the voltage of the gate terminal C of the first driving transistor 311 may rise up to only a voltage corresponding to the sum of the PAM data voltage and the threshold voltage of the first driving transistor 311 instead of rising up to the input PAM data voltage.

When the PAM data voltage is first applied to the first internal compensation circuit 31, a voltage of the gate terminal C of the first driving transistor 311 is in a low state (for example, −5V) and the first driving transistor 311 is fully turned on, and thus a sufficient current flows and the gate terminal C voltage of the first driving transistor 311 smoothly rises. However, a difference of voltage between the gate terminal and the source terminal of the first driving transistor 311 is reduced with the increase of the gate terminal C voltage of the first driving transistor 311, and thus a current flow decreases, and as a result, when the difference of voltage between the gate terminal and the source terminal of the first driving transistor 311 reaches the threshold voltage of the first driving transistor 311, the first driving transistor 311 is turned off and the current flow is stopped.

That is, a PAM data voltage is applied to the source terminal of the first driving transistor 311, and thus the voltage of the gate terminal C of the first driving transistor 311 may rise only up to a voltage corresponding to the sum of the PAM data voltage and the threshold voltage of the first driving transistor 311. As described above, the threshold voltage of the first driving transistor 311 can be compensated.

The structure and operation of the second internal compensation circuit 31 are similar to the structure and operation of the first internal compensation circuit 32; therefore, a detailed description thereof will be omitted herein.

As described above, according to an example embodiment, the PAM driving circuit 310 may automatically perform an internal compensation to the threshold voltage of the first driving transistor 311 while setting (or applying) the applied PAM data voltage to the gate terminal C of the first driving transistor 311, and so may the PAM driving circuit 320.

Meanwhile, the term "internal compensation" means that threshold voltages of the first and second driving transistors 311 and 321 are autonomously compensated within the driving circuit 300 while the driving circuit 300 is operated due to a connection structure of the first or second internal compensation circuit 31 or 32 as illustrated in FIG. 8, and this internal compensation method is distinct from an external compensation method to compensate threshold voltages of the driving transistors 311 and 312 by correcting a data voltage itself to be applied from outside of the driving circuit 300 to the driving circuit 300.

As described above, the threshold voltages of the driving transistors 311 and 321 are internally compensated and thus, according to an example embodiment, when setting a PAM data voltage in all pixels (or all sub pixels) included in the display panel 1000 and 1000' to display one image frame, the PAM data voltage may be applied at once to all the pixels (or all the sub pixels) included in the display panel 1000 and 1000'. Accordingly, it is possible to secure a sufficient light emitting interval for the light emitting device 200 to emit light from among the entire time interval for displaying one image frame.

This is a distinct feature from an external compensation method in which it is necessary to sequentially scan the pixels included in the display panel 1000 and 1000' for each line and separately apply the PAM data voltage for which the threshold voltage has been compensated for each line.

According to the example embodiment described above, the PWM data voltage may be sequentially applied to the pixels included in the display panel 1000 and 1000' for each line to express a grayscale or gradation for each line.

Figure 9:
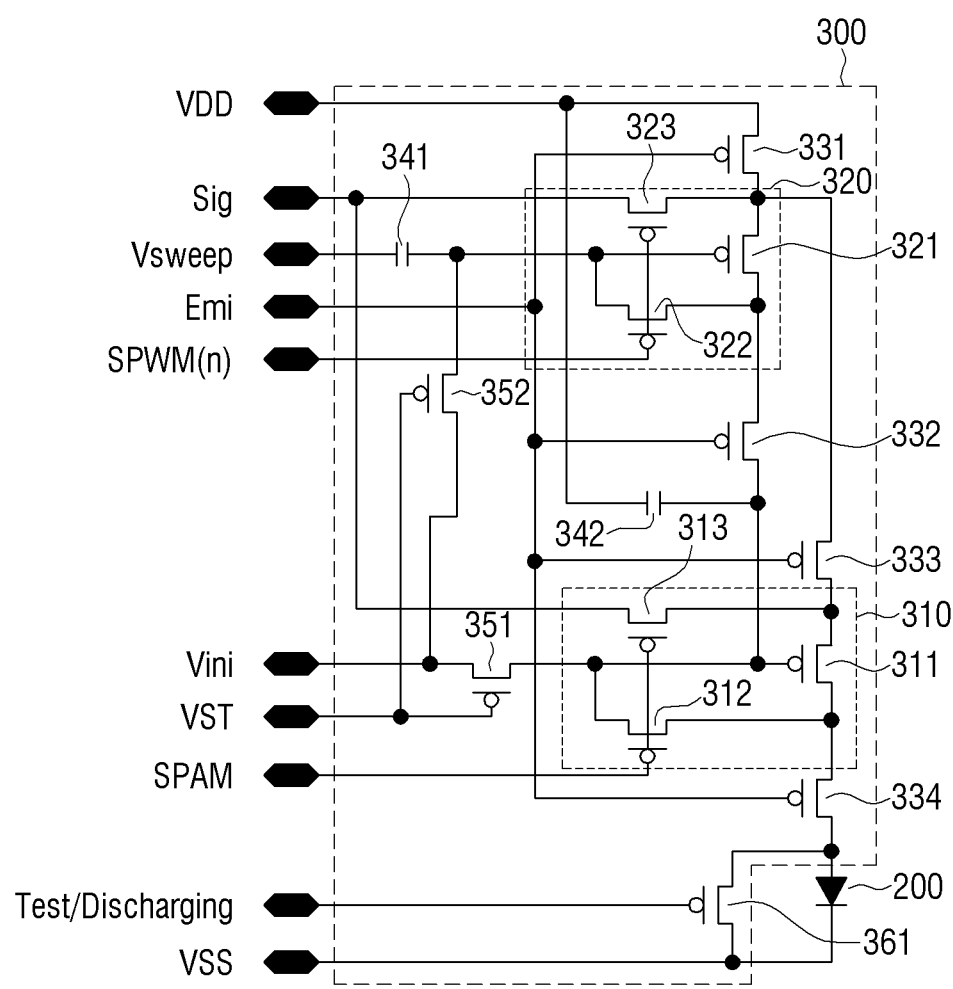
FIG. 9 is a detailed circuit diagram of a driving circuit, according to an example embodiment.
Figure 10:
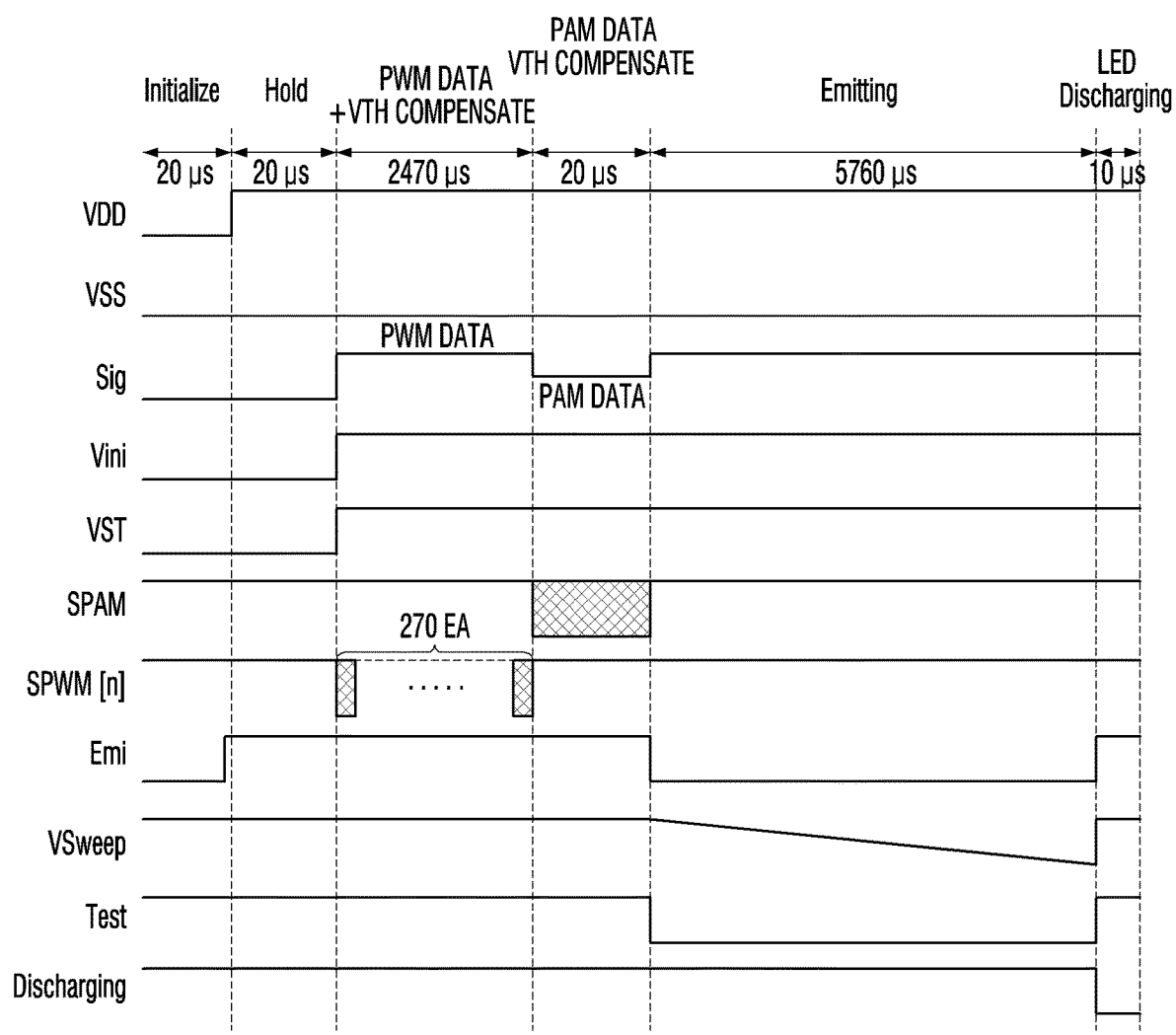
FIG. 10 is a timing diagram of various signals for driving a driving circuit of FIG. 9, according to an example embodiment.

The following will explain the details and operation of the driving circuit 300 in detail by referring to FIGS. 9 and 10.

FIG. 9 is a detailed circuit diagram of a driving circuit 300, according to an example embodiment. The devices included in the driving circuit 300 and a connection relationship between the devices will be first described with reference to FIG. 9.

FIG. 9 illustrates one sub pixel-related circuit, that is, one light emitting device 200, and a driving circuit 300 for driving the light emitting device 200. Accordingly, the light emitting device 200 and the driving circuit 300 as illustrated in FIGS. 7A and 7B may be provided in the display panel 1000 and 1000' by the sub pixel. Meanwhile, the light emitting device 200 may be an LED in any one color from among R, G and B.

Referring to FIG. 9, the driving circuit 300 may include a PAM driving circuit 310, a PWM driving circuit 320, fifth to eighth transistors 331, 332, 333 and 334, a ninth transistor 351, a tenth transistor 352, an eleventh transistor 361, a first capacitor 341, and a second capacitor 342.

The PAM driving circuit 310 may include a first driving transistor 312, a second transistor 312 connected to and disposed between a gate terminal and a drain terminal of the first driving transistor 311, and a third transistor 313 including a drain terminal connected to a source terminal of the first driving transistor 311, a gate terminal connected to a gate terminal of the first transistor 312, and a source terminal via which a data signal (Sig) is received.

When the PAM data voltage is applied through the source terminal of the second transistor 313 while the first and second transistors 312 and 313 are turned on according to the control signal (SPAM), the PAM driving circuit 310 may apply, to a gate terminal C of the first driving circuit 311, a first voltage corresponding to the sum of the applied PAM data voltage and the threshold voltage of the first driving transistor 311 through the turned-on first driving transistor 311 and the turned-on first transistor 312.

The PWM driving circuit 320 may include a second driving transistor 321, a third transistor 322 connected to and disposed between the gate terminal and the drain terminal of the second driving transistor 321, and a fourth transistor 323 including a drain terminal connected to a source terminal of the second driving transistor 321, a gate terminal connected to a gate terminal of the first transistor 312, and a source terminal via which a data signal (Sig) is received.

When the PWM data voltage is applied through the source terminal of the fourth transistor 323 while the third and fourth transistors 322 and 323 are turned on according to the control signal (SPWM(n)), the PWM driving circuit 320 may apply, to a gate terminal A of the second driving circuit 321, a second voltage corresponding to the sum of the applied PWM data voltage and the threshold voltage of the second driving transistor 321 through the turned-on second driving transistor 321 and the turned-on third transistor 322.

A drain terminal of the fifth transistor 331 may be connected to a driving voltage terminal (or driving voltage signal) (VDD) of the driving circuit 300, and a drain terminal of the fifth transistor 331 may be commonly connected to a drain terminal of the fourth transistor 323 and a source terminal of the second driving transistor 321.

The fifth transistor 331 may be turned on or off according to a control signal (Emi), and electrically connect the driving voltage terminal (VDD) and the PWM driving circuit 320 or separate them from each other.

The sixth transistor 332 may include a source terminal connected to the drain terminal of the second driving transistor 321, and a drain terminal connected to the gate terminal of the first driving transistor 311.

The seventh transistor 333 may include a source terminal which is commonly connected to the source terminal of the second driving transistor 321, the drain terminal of the fourth transistor 323 and the drain terminal of the fifth transistor 331, and a drain terminal which is commonly connected to the source terminal of the first driving transistor 311 and the drain terminal of the second transistor 313.

The sixth and seventh transistors 332 and 333 may be turned on or off according to the control signal (Emi), and electrically connect the PWM driving circuit 320 and the PAM driving circuit 310 or separate them from each other.

The eighth transistor 334 may include a source terminal connected to the drain terminal of the first driving transistor 311, and a drain terminal connected to an anode terminal of the light emitting device 200. The eighth transistor 334 may be turned on or off according to the control signal (Emi), and electrically connect the PAM driving circuit 310 and the light emitting device 200 or separate them from each other.

The first capacitor 341 may include a first terminal which is commonly connected to the gate terminal of the second driving transistor 321 and the drain terminal of the third transistor 322, and a second terminal for receiving a sweep signal (Vsweep) which is a linearly-shifting voltage.

The ninth capacitor 351 may include a drain terminal which is commonly connected to the gate terminal of the first driving transistor 311 and the drain terminal of the first transistor 312, and a source terminal for receiving an initial voltage (Vini). The tenth transistor 352 may include a source terminal connected to the first terminal of the first capacitor 341, and a drain terminal connected to the source terminal of the ninth driving transistor 351.

The second capacitor 342 may include a first terminal which is connected to the driving voltage terminal VDD), and a second terminal which is commonly connected to the gate terminal C of the first driving transistor 311, the drain terminal of the first transistor 312, the drain terminal of the ninth transistor 351 and the drain terminal of the sixth transistor 332.

The ninth transistor 351 and the tenth transistor 352 may be turned on according to a control signal (VST), and apply the initial voltage (Vini) to the gate terminal C of the first driving transistor 311 and the gate terminal A of the second driving transistor 321.

The ninth transistor 351 and the tenth transistor 352 may, to prevent the driving voltage (VDD) from being coupled to the gate terminal C of the first driving transistor 311 through the second capacitor 342 after the voltages of the gate terminals C and A of the first and second driving transistors 311 and 321, maintain a turn-on state according to the control signal (VST) for a predetermined time after the driving voltage (VDD) is applied to the first terminal of the second capacitor 342, and apply the initial voltage (Vini) to the gate terminals C and A of the first and second driving transistors 311 and 321.

The eleventh transistor 361 may be connected to in between the anode terminal and the cathode terminal of the light emitting device 200. The eleventh transistor 361 may be, before the light emitting device 200 is mounted on the TFT layer 3000 and electrically connected to the driving circuit 300, turned on according to the control signal (Test) to check the abnormality of the driving circuit 300, and after the light emitting device 200 is mounted on the TFT layer 3000 and electrically connected to the driving circuit 300, turned on according to a control signal (Discharging) to discharge the charge remaining in the light emitting device 200.

Meanwhile, the cathode terminal of the light emitting device 200 may be connected to a ground voltage (VSS) terminal.

The following will explain the operation of the driving circuit 300 in detail by referring to FIG. 10. FIG. 10 is a timing diagram of various signals for driving a driving circuit of FIG. 9, according to an example embodiment. Numerical values of the various voltages and times described below are only an example, and the example is not limited to the corresponding values.

Referring to FIG. 10, the driving circuit 300 may be driven in the order of an initialization duration (Initialize), a maintain duration (Hold), a data voltage setup and threshold voltage (Vth) compensation duration, a light emitting duration (Emitting), and a discharge duration (LED Discharging) to display one image frame.

In this case, as in the example illustrated in FIG. 10, the data voltage setup and threshold voltage (Vth) compensation duration may include a PAM data voltage setup and a second driving threshold voltage 321 threshold voltage compensation duration (PWM data+Vth compensation), and a PAM data voltage setup and first driving transistor 311 threshold voltage compensation duration (PAM data+Vth compensation).

The initialization duration is a duration for initializing voltages of the gate terminals C and A of the first and second driving transistors 311 and 321. The driving circuit 300 may initialize the voltages of the C and A terminals to the initial voltage (for example, −5V) during the initialization duration.

For example, during the initialization duration, the ninth and tenth transistors 351 and 352 are turned on according to the control signal (VST), and thus the initial voltage (Vini) (for example, −5V) may be applied to the gate terminal C of the first driving transistor 311 through the ninth transistor 351, and applied to the gate terminal A of the second driving transistor 321 through the tenth transistor 352.

During the initialization duration, all fifth to eighth transistors 331, 332, 333 and 334 are turned on according to the control signal (Emi), and thus the driving voltage (VDD) terminal and the ground voltage (VSS) terminal may be respectively connected to both terminals of the light emitting device 200. However, during the initialization duration, the ground voltage (VSS, for example, −5V) is applied to the driving circuit 300 instead of the driving voltage (VDD, for example, +5V) through the driving voltage (VDD) terminal, and thus −5V may be respectively applied to both ends of the light emitting device 200 and the light emitting device 200 does not emit light.

The maintain duration is a duration for maintaining voltages of the gate terminals C and A of the first and second driving transistors 311 and 321 in a low state (that is, initialized state) because it is necessary that the first and second driving transistors 311 and 312 are in a turn-on state when the data voltage setup and threshold voltage (Vth) compensation duration starts.

For example, during the maintain duration, a voltage of the driving voltage terminal may rise from the ground voltage (−5V) to the driving voltage (+5V) because it is necessary that the driving voltage (VDD, +5V) is applied to the driving voltage terminal to enable the light emitting device 200 to emit light.

However, this voltage shift of the driving voltage terminal may be coupled to the respective terminals of the driving circuit 300 and affect them. In particular, the driving voltage terminal is connected to the gate terminal C of the first driving transistor 311 via the second capacitor 342, and thus the gate terminal C voltage of the initialized first driving transistor 311 may be significantly affected.

To minimize this effect to coupling voltage, according to an example embodiment, as illustrated in FIG. 10, the fifth to eighth transistors 331 to 334 may be first turned off by the control signal (Emi) before the voltage of the driving voltage terminal rises from −5V to +5V. When the fifth to eighth transistors 331 to 334 are turned off, the driving voltage terminal, the PAM driving circuit 310, the PWM driving circuit 320 and the light emitting device 200 are electrically separated from each other, and thus a coupling effect can be reduced.

According to an example embodiment, the coupling effect may be reduced by taking a maintain time (Hold) and continuously applying the initialization voltage (Vini, for example, −5V) to the terminals C and A. For example, even if the voltage of the driving voltage terminal rises from −5V to +5V, the ninth and tenth transistors 351 and 352 may maintain a turn-on state during the maintain time so that the initial voltage (Vini, for example, −5V) is continuously applied to the gate terminals C and A of the first and second driving transistors 311 and 321.

Meanwhile, a voltage of the driving voltage terminal is raised immediately after the initialization duration as illustrated in FIG. 10 rather than during the data voltage setup/threshold voltage (Vth) compensation duration or light emitting duration (Emitting) because it is possible to stably operate the driving circuit 300 only when a data voltage is set after an effect from a voltage shift of the driving voltage terminal being coupled to the respective nodes of the driving circuit 300 is stabilized.

The data voltage setup and threshold voltage compensation duration is a duration for setting a data voltage to the respective PAM driving circuit 310 and the PWM driving voltage 320, and compensating threshold voltages (Vth) of the first and second driving transistors 311 and 321.

According to an example embodiment, as illustrated in FIG. 10, the PWM data voltage setup and the compensation of threshold voltage of the second driving transistor 321 are performed first and then, the PAM data voltage setup and the compensation of threshold voltage of the first driving transistor 311 may be performed. However, in an implementation, the order may be changed.

Meanwhile, during the data voltage setup and threshold voltage compensation duration, all fifth to eighth transistors 331 to 334 are turned off according to the control signal (Emi, for example, +5V) and accordingly, the data voltage setup and the threshold voltage compensation may be performed in the PAM driving circuit 310 and the PWM driving circuit 320 independently of each other.

First, the PWM data voltage setup and second driving transistor 321 threshold voltage compensation duration (PWM data+Vth compensation) is a duration for which the PWM data voltage transferred from the data line (Sig cable) is applied to the gate terminal A of the second driving transistor 321.

For example, when the third and fourth transistors 322 and 323 are turned on according to the control signal (SPWM(n), for example, −5V), the PWM data voltage may sequentially pass through the fourth transistor 323, the second driving transistor 321 and the third transistor 322, and the compensated voltage (a voltage corresponding to the sum of the PWM data voltage and the threshold voltage of the second driving transistor 321) may be input to the node A. Accordingly, the compensated voltage may be stored in the first capacitor 341 and the node A may maintain a floating state.

Meanwhile, the control signal (SPWM(n)) may be a signal which is output from a gate driver inside or outside of the display panel 1000 and 1000'. In the SPWM(n), the n refers to a number of pixel lines included in the display panel 1000 and 1000'.

For example, in a case that a plurality of pixels arranged in a matrix form in the display panel 1000 and 1000' constitute 270 horizontal lines (or rows), a gate driver may output a control signal, that is, SPWM 1 to SPWM 270, that sequentially turns on, for each line, the third and fourth transistors 322 and 323 of pixels (or sub pixels) included in the respective lines from line 1 to line 270.

Accordingly, the third and fourth transistors 322 and 323 of the pixels (or sub pixels) included in the display panel 1000 and 1000' may be sequentially turned on for each line, and the PWM data voltage may be sequentially applied to a plurality of pixels arranged in the matrix form (that is, a plurality of PWM driving circuits 320) for each line of the plurality of pixels.

First, the PWM data voltage setup and second driving transistor 311 threshold voltage compensation duration (PWM data+Vth compensation) is a duration for which the PAM data voltage transferred from the data line (Sig cable) is applied to the gate terminal C of the first driving transistor 311.

For example, during the PAM data voltage setup and first driving transistor 311 threshold voltage compensation duration, the control signal (SPAM) is −5V and thus, the first transistor 312 and the second transistor 313 may be turned on.

Like the principle of internal compensation of the PWM driving circuit 320, the PAM data voltage is input to the node C via the second transistor 313, the first driving transistor 311 and the first transistor 312, and thus a voltage corresponding to the sum of the PAM data voltage and the threshold voltage of the first driving transistor 311 may be input to the node C. Accordingly, the compensated voltage may be stored in the second capacitor 342 and the node C may maintain a floating state.

Meanwhile, the control signal (SPAM) may be a signal which is output from a gate driver inside or outside of the display panel 1000 and 1000'. According to an example embodiment, the control signal SPAM may be, unlike the control signal SPWM(n), applied at once to all pixels (or all sub pixels) included in the display panel 1000 and 1000'.

For example, in a case that a plurality of pixels arranged in a matrix form in the display panel 1000 and 1000' constitute 270 horizontal lines (or rows), a gate driver may output a control signal, that is, a SPAM, that turns on the first and second transistors 312 and 313 of all pixels (or sub pixels) included in the 270 horizontal lines (or rows) included in the display panel 1000 and 1000' at once.

Accordingly, the first and second transistors 312 and 313 of all pixels (or sub pixels) included in the display panel 1000 and 1000' may be turned on at once, and the PAM data voltage may be applied at once to a plurality of pixels arranged in the matrix form (that is, a plurality of PAM driving circuits 310).

According to an example embodiment, the PAM data voltage applied at once to all sub pixels (more accurately, all PAM driving circuits 310) included in the display panel 1000 and 1000' may be a voltage of the same magnitude.

In addition, according to an example embodiment, the display panel 1000 and 1000' may be divided into a plurality of areas, wherein the PAM data voltage applied at once to all sub pixels (more accurately, all PAM driving circuits 310) included in the display panel 1000 and 1000' may be applied differently according to areas. This will be explained in more detail hereinbelow with reference to FIGS. 12A and 12B.

The light emitting duration (Emitting) is a duration for which the light emitting device 200 emits light. During the light emitting duration, the light emitting device 200 may emit light according to an amplitude and a pulse width of a driving current provided by the driving circuit 300, thereby expressing a grayscale or gradation corresponding to the applied PAM data voltage and the applied PWM data voltage.

For example, during the light emitting duration, the fifth to eighth transistors 331 to 334 are turned on according to the control signal (Emi, for example, −5V), and thus the PAM driving circuit 310 and the PWM driving circuit 320 may be electrically connected to each other, and electrically connected to the driving voltage terminal and the light emitting device 200 as well.

When the light emitting duration is initiated, the driving voltage (VDD, for example, +5V) may be transferred to the light emitting device 200 via the fifth transistor 331, the seventh transistor 333, the first driving transistor 311 and the eighth transistor 334, and thus a potential difference of +10 V may occur at both terminals of the light emitting device 200 and the light emitting device 200 may emit light. The driving current illuminating the light emitting device 200 may have an amplitude corresponding to the PAM data voltage.

During the light emitting duration, a sweep voltage (Vsweep) which is a linearly-shifting voltage may be applied to the first capacitor 341. For example, in a case that the sweep voltage (Vsweep) is a voltage gradually decreased from +4V to 0V, a coupling voltage occurs at the gate terminal A of the second driving transistor 321 in the floating state via the first capacitor 341.

Accordingly, the voltage of the node A is reduced according to the sweep voltage, and when the decreasing voltage of the node A reaches the threshold voltage of the second driving transistor 321, the second driving transistor 321 is shifted from a turn-off state to a turn-on state.

When the second driving transistor 321 is turned on, the driving voltage (VDD) (for example, +5V) may be transferred to the node C via the fifth transistor 331, the second driving transistor 321 and the sixth transistor 332. The driving voltage (VDD) is +5V, and thus, when the VDD is applied to the node C, the first driving transistor 311 may be turned off. When the first driving transistor 311 is turned off, the driving voltage (VDD) may not reach the light emitting device 200 and thus, the light emission of the light emitting device 200 may be ended.

As described above, from a time when the driving voltage (VDD) (for example, +5V) is applied to the light emitting device 200 until a time when a voltage applied to the gate terminal A of the second driving transistor 321 is shifted according to the sweep voltage (Vsweep) and becomes the threshold voltage of the second driving transistor 321, the PWM driving circuit 320 may provide the driving current to the light emitting device 200. That is, the driving current may have a pulse width of a magnitude corresponding to the PWM data.

Meanwhile, an electrical charge remaining in the light emitting device 200 may be present even when the light emission of the light emitting device 200 has ended. Accordingly, a problem that the light emitting device 200 is slightly illuminated after the light emission has ended may be caused, which may be a problem especially when a low grayscale or gradation (for example, black) is expressed.

The discharge duration (LED discharging) is an interval for discharging an electrical charge remaining in the light emitting device 200 after the light emitting duration ends. The driving circuit 300 may turn on the eleventh transistor 361 according to the control signal (Discharging) so that the electrical charge remaining in the light emitting device 200 is fully discharged to the ground voltage (VSS) and accordingly, the problem mentioned above can be solved.

Meanwhile, before the light emitting device 200 is mounted on the TFT layer 3000 and electrically connected to the driving circuit 300, the eleventh transistor 361 may be used to check the abnormality of the driving circuit 300. For example, the engineer or manufacturer of the product may turn on the eleventh transistor 361 through the control signal (Test) during the light emitting duration and then identify a current flowing through the eleventh transistor 361, and thereby the abnormality (for example, a short or open of a circuit, etc.) of the driving circuit 300 may be checked.

The various data signal (Sig), the power signal (VDD and VSS) and the control signal (Vsweep, Emi, SPWM(n), SPAM, Vini, VST, Test/Discharging) illustrated in FIG. 10 may be received from an external timing controller (TCON), a processor, various drivers (for example, data driver and gate driver), etc. This feature is not related to the main idea of one or more example embodiments and thus a detailed description thereof is omitted herein.

As illustrated in FIG. 10, according to an example embodiment, the PAM data voltage may be applied at once to all PAM driving circuits 310 included in the display panel 1000 and 1000'. In this way, a threshold voltage of a driving transistor of a PAM driving circuit is compensated in an external compensation way, which is different from a related art where it is necessary to scan a pixel line to set a PAM data voltage.

For example, in a case that an image is displayed at 120 Hertz (Hz), it takes 8300 microseconds (μs) to display one image frame. However, in a case that a display panel includes 270 horizontal lines (rows), it takes a time of approximately 2470 μs to scan all the lines.

Accordingly, in a case that an external compensation method is used, to set a PWM data voltage and a PAM data voltage to the entire driving circuits included in the display panel, it takes approximately 5000 μs, and thus, it is unlikely that a percentage of time that may be occupied by a light emitting duration per frame will exceed 40%, as shown in (3300/8300)*100=39.8%.

However, according to an example embodiment, the PAM data voltage is applied at once and set to the driving circuit 300, and thus, when calculating a percentage of time that may be occupied by a light emitting duration per frame with reference to a time allocated to the respective durations illustrated in FIG. 10, it may be understood that at least 65% is secured as shown in (5760/8300)*100=69.3%.

As described above, when a sufficient light emitting duration is secured, it is possible to delete various resources (for example, functions related to TCON, memory, data driver, PCT, etc.) required to externally compensate all threshold voltages of related-art PWM and PAM driving transistors, thus simplifying operations and reducing costs.

The shorter the light emitting duration, the shorter a light emission control duration for each grayscale or gradation. Thus, it may be difficult to express various grayscales or gradations through the PWM method. However, the example embodiment described above may solve this problem and may solve a problem for life extension of the light emitting device.

Figure 11A:
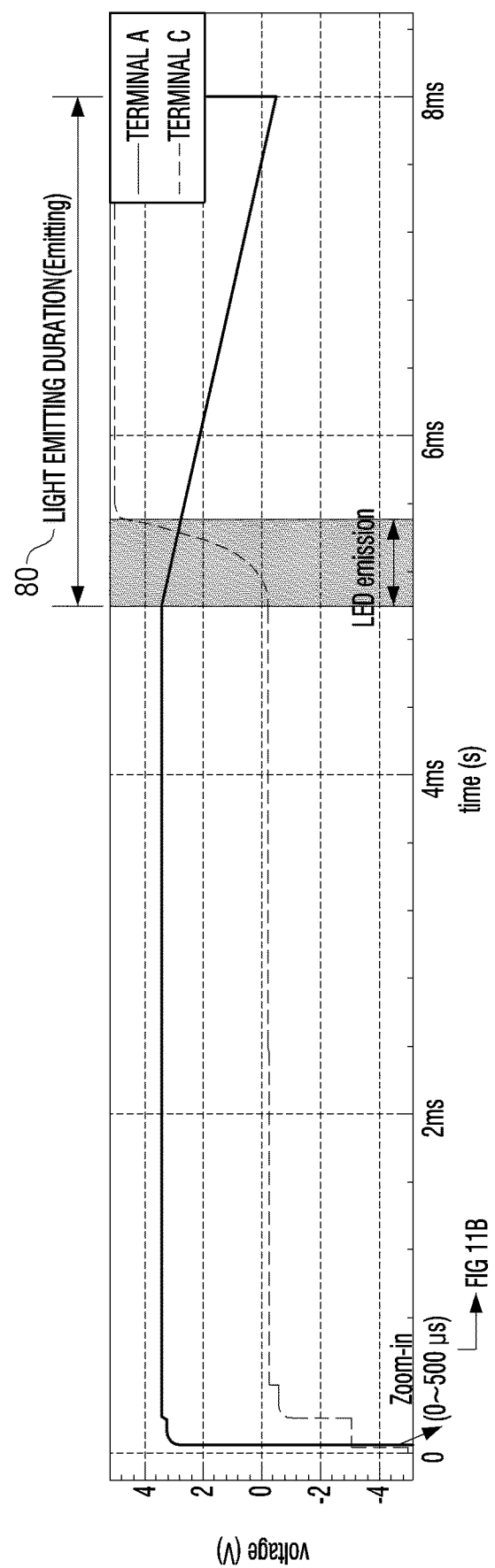
FIG. 11A is experiment waveforms for nodes A and C of a driving circuit, according to an example embodiment.
Figure 11B:
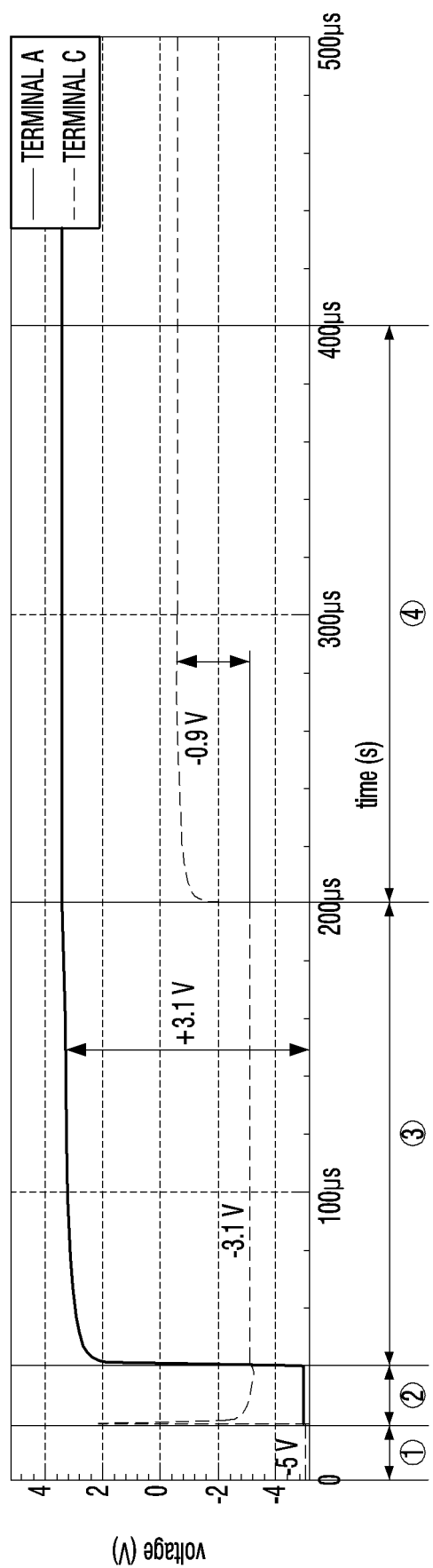
FIG. 11B is experiment waveforms for nodes A and C of a driving circuit, according to an example embodiment.

FIGS. 11A and 11B are experiment waveforms for nodes A and C of a driving circuit 300, according to an example embodiment. In particular, FIG. 11B is an enlarged view of 0 µs to 500 µs in the waveform illustrated in FIG. 11A.

In the experiment, the PWM data voltage and the PAM data voltage are set to +5V and +1V, respectively, and both threshold voltages of the first and second driving transistors 311 and 321 are set to −1.9V. According to an example embodiment, the PAM data voltage is, as illustrated in FIG. 10, applied after the initialization duration (20 µs), the maintain duration (20 µs), and the PWM data voltage setup and the second driving transistor 321 threshold voltage compensation duration (2470 µs). However, for convenience of explanation, the PAM data is applied at 200 us.

Referring to FIG. 11B, it may be understood that the nodes A and C is initialized to −5V during an interval ① (initialization duration, 20 µs).

As an interval ② (maintain duration, 20 µs to 40 µs) is initiated, a voltage of a driving voltage terminal rises from −5V to +5V, and thus, due to a coupling effect, it may be understood that a voltage of the terminals (in particular, terminal C) rises up to 2V. However, as described above, during the maintain interval, an initial voltage (Vini, for example, −5V) is continuously applied to the terminals A and C, and thus a voltage of the node C is immediately stabilized and is kept at approximately −3.1V. This voltage is not −5V, but is a sufficient voltage to turn on the first driving transistor 311.

Meanwhile, the PWM data voltage is applied during the interval ③ (PWM data voltage setup and second driving transistor 321 threshold voltage compensation duration), and accordingly a voltage of +3.1V is maintained at the node A. The PWM data voltage is +5V and the threshold voltage of the second driving transistor 321 is −1.9V, and thus it is necessary that the two voltages are added together and stored in the node A, and this matches with the experiment result.

Meanwhile, the PAM data voltage (+1V) is applied during the interval ④ (PWM data voltage setup and first driving transistor 311 threshold voltage compensation duration), and thus it is necessary that −0.9V which is a voltage corresponding to the sum of the PAM data voltage (+1V) and the threshold voltage (−1.9V) of the first driving transistor 311) in the node C, and this matches with the experiment result as well.

As described above, the compensated voltage may be set to the nodes A and C, and then the light emitting device 200 may emit light during the light emitting duration. In this case, the light emitting device 200 emits light for a time corresponding to the PWM data voltage, where the time corresponding to the PWM data voltage is a period from a time when the light emitting duration is started that is, when a driving voltage (VDD) is applied to the light emitting device 200, to a time when a voltage applied to the node A is shifted according to the sweep signal (Vsweep) and becomes the threshold voltage of the second driving transistor 321.

Referring to FIG. 11A, it may be understood that the light emitting device 200 emits light from when the light emitting duration 80 is started. In addition, it may be understood that a voltage of the node A is linearly reduced according to the sweep signal (Vsweep), and that when the linearly-reduced voltage of the node A reaches a particular voltage, the light emitting device 200 stops emitting light. (See, LED emission of FIG. 11A)

Figure 12A:
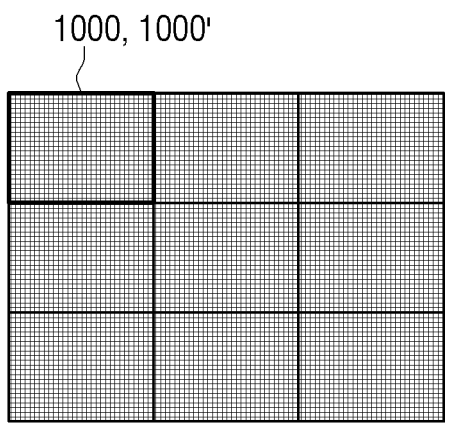
FIG. 12A is a diagram illustrating a high dynamic range (HDR) realized through a display panel, according to an example embodiment.
Figure 12B:
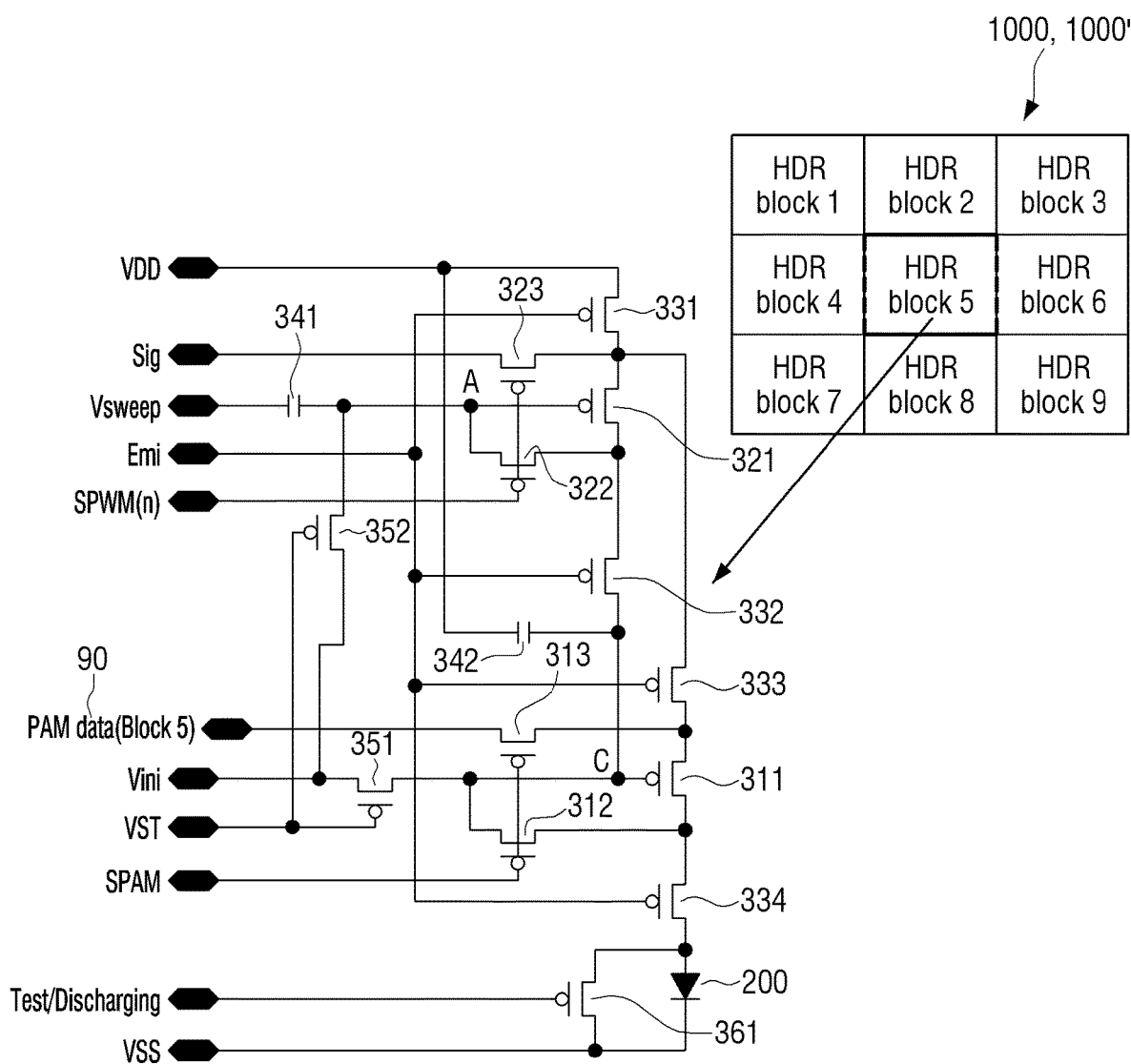
FIG. 12B is a diagram illustrating a high dynamic range (HDR) realized through a display panel, according to an example embodiment.

FIGS. 12A and 12B are diagrams illustrating a high dynamic range (HDR) realized through a display panel 1000 and 1000', according to an example embodiment.

The HDR is a technology for further brightening an area with a brighter grayscale or gradation and darkening an area with a darker grayscale or gradation in a digital image to extend a dynamic range of brightness so that the digital image is visible as if the image is seen through naked eyes. The HDR function may be realized by means of the display panel 1000 and 1000' according to the example embodiments.

According to an example embodiment, one large-scale display panel 10000 may be configured by combining a plurality of display panels 1000 and 1000'. When it is assumed that the respective display panels 1000 and 1000' included in the large-scale display panel 10000 is a modular panel, FIG. 12A illustrates an example embodiment in which nine modular panels constitute one large-scale display panel 10000. The number of modular panels included in the large-scale display panel 10000 is not limited thereto. For example, a large-scale display panel may be configured with various numbers of modular panels such as four, twelve, and the like.

As described above, the PAM data voltage applied at once to all sub pixels (more accurately, all PAM driving circuits 310) included in the display panel 1000 and 1000' may be a voltage of the same magnitude, and FIG. 9 corresponds to this example embodiment. That is, in the example of FIG. 9, the PAM data voltage is applied at once to all sub pixels included in the display panel 1000 and 1000' via one data line (Sig cable), and thus a PAM data voltage of the same magnitude may be applied. That is, the same PAM data voltage may be applied to one modular panel.

However, an example where it is necessary to apply the same PAM data voltage to all sub pixels is only limited to one display panel 1000 and 1000', and the respective modular panel further includes its own data line (Sig cable), and thus a PAM data voltage of different magnitudes may be applied for each modular panel.

Accordingly, in a case that a modular panel for which an HDR driving is required in a large-scale display panel 10000 as illustrated in FIG. 12A, a PAM data voltage distinct from a PAM data voltage of another modular panel may be applied to the corresponding modular panel so that the HDR function is realized. For example, to express a brighter part of the image even brighter, a higher PAM data voltage than the other modular panel may be applied to a modular panel including the bright part.

Meanwhile, the example of implementation of the HDR function is not limited thereto. For example, as illustrated above, the display panel 1000 and 1000', that is, a modular panel may be divided into a plurality of areas and an HDR may be implemented by the plurality of areas.

The right drawing of FIG. 12B illustrates an example embodiment in which one modular panel is divided into nine areas, that is, nine HDR blocks. However, example embodiments are not limited to any specific examples. For example, according to an example embodiment, one modular panel may be implemented to include various numbers of HDR blocks such as four, twelve, and the like.

In this case, it is necessary that a different PAM data voltage is applied to a block for which the HDR driving is required while applying a PAM data at once to all sub pixels included in the modular panel. To this end, according to an example embodiment, an additional cable for applying the PAM data voltage for each HDR block may be provided.

The circuit diagram illustrated on the left side of FIG. 12B illustrates a driving circuit 300 included in one sub pixel from among all sub pixels included in the HDR block 5. As illustrated, it may be understood that an additional data line (PAM data (Block 5), 90) is included.

As described above, in a case that one display panel 1000 and 1000' is divided into a plurality of areas and an additional data line for applying the PAM data voltage is provided for each area, an HDR may be realized for each of the plurality of areas even in one modular panel.

In the example described above, all transistors 311, 312, 313, 321, 322, 323, 331, 332, 333, 334, 351, 352 and 361 included in the driving circuit 300 are implemented as a P-channel metal oxide semiconductor field effect transistor (PMOSFET), but are not limited thereto. However, example embodiments are not limited to any specific examples. According to an example embodiment, a driving circuit of which all transistors are implemented as an N-channel metal oxide semiconductor field effect transistor (NMOSFET) may be implemented to perform the same operation as the driving circuit 300 as described above.

The driving circuit including the NMOSFET may perform the same operation as the driving circuit 300 of FIG. 9 or 12B except a difference due to a type of transistor (for example, a difference of connection relationship between devices and a difference of polarity of various signals to be applied). The operation of the driving circuit implemented as an NMOSFET through the description above would be easily understood by those skilled in the art based on a PMOSFET, and thus an unnecessary overlapping description will not be provided below.

Figure 13:
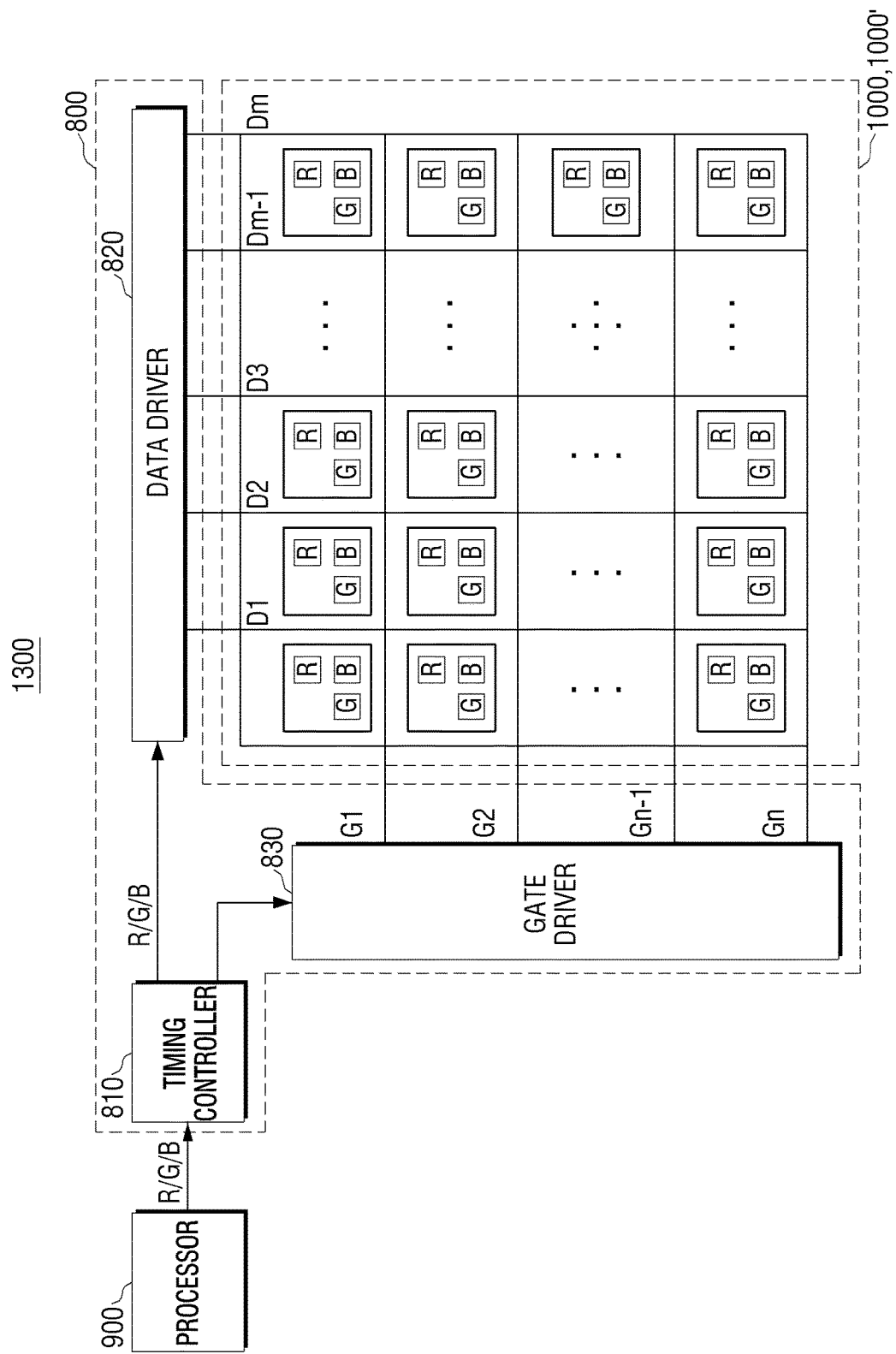
FIG. 13 is a diagram illustrating a configuration of a display apparatus, according to an example embodiment.

FIG. 13 is a diagram illustrating a configuration of a display apparatus, according to an example embodiment. Referring to FIG. 13, a display apparatus 1300 may include a display panel 1000 and 1000', a panel driver 800, and a processor 900.

The display panel 1000 and 1000' may include a plurality of light emitting devices 200 included in a plurality of sub pixels, and a plurality of driving circuits 300 for driving the respective light emitting devices 200.

For example, the display panel 1000 and 1000' may be disposed such that gate lines G1 to Gn and data lines D1 to Dm intersect with each other, and the driving circuit 300 may be disposed in an area in which the intersection is provided. For example, the plurality of driving circuits 300 may be respectively configured such that adjacent R, G and B sub pixels form one pixel, but the example is not limited thereto.

The panel driver 800 may be controlled by the processor 900 to drive the display panel 1000 and 1000' (in more detail, each of the plurality of driving circuits 300), and may include a timing controller 810, a data driver 820, and a gate driver 830.

The timing controller 810 may receive an input signal IS, a horizontal synchronizing signal Hsync, a vertical synchronizing signal Vsync and a main clock signal MCLK from the outside, and generate an image data signal, a scanning control signal, a data control signal, a data control signal, a light emission control signal, and the like to the display panel 1000 and provide the generated signals to the display panel 1000 and 1000', the data driver 820, the gate driver 830, and the like.

For example, according to various example embodiments, the timing controller 810 may apply at least one of various signals (Emi, Vsweep, Vini, VST and Test/Discharging) to the driving circuit 300. According to an example embodiment, a control signal (MUX Sel R, G and B) for selecting one sub pixel from among the R, G and B sub pixels may be applied to the driving circuit 300.

The data driver 820, or source driver and data driver, may, as a means for generating a data signal, receive an image data of an R/G/B component from the processor 900 and generate a data voltage (for example, PWM data voltage and PAM data voltage). In addition, the data driver 820 may apply the generated data signal to the display panel 1000 and 1000'.

The gate driver 830 (or gate driver) may, as a means for generating various control signals such as a control signal (SPWM(n)), a control signal (SPAM), and the like, transfer the generated various control signals to a particular row (or a particular horizontal line) of the display panel 1000 and 1000' or to the entire lines.

In addition, the gate driver 830 may apply a driving voltage (VDD) to the driving voltage terminal of the driving circuit 300 according to an example embodiment.

Meanwhile, as described above, some or all of the data driver 820 and the gate driver 830 may be implemented to be included in a TFT layer 3000' disposed on one surface of the glass 100 of the display panel 1000' or implemented as an additional semiconductor integrated circuit (IC) and arranged on the other surface of the glass 100.

The processor 900 may include various processing circuitry and controls overall operations of the display apparatus 1300. In particular, the processor 900 may control the panel driver 800 to drive the display panel 1000 and 1000' so that the driving circuit 300 performs the operations described above.

To this end, the processor 900 may include one or more of a central processing unit (CPU), micro-controller, application processor (AP), communication processor (CP), ARM processor, or the like.

For example, according to an example embodiment, the processor 900 may set a pulse width of a driving current according to a PWM data voltage, and control the panel driver 800 to set an amplitude of the driving current according to a PAM data voltage. In a case that the display panel 1000 and 1000' includes a n number of columns and a m number of rows, the processor 900 may control the panel driver 800 to the PWM data voltage by the row (by the horizontal line). In addition, the processor 900 may control the panel driver 800 to apply the PAM data voltage at once to the entire sub pixels of the display panel 1000 and 1000'.

Thereafter, the processor 900 may apply a driving voltage (VDD) at once to the plurality of driving circuits 300 and 700 included in the display panel 1000 and 1000', and control the panel driver 800 to apply a linear shift voltage (sweep signal) to a PWM driving circuit 320 of each of the plurality of driving circuits 300, and thereby an image can be displayed.

In this case, the detail of the processor 900 controlling the panel driver 800 to control an operation of the respective driving circuits 300 included in the display panel 1000 and 1000' is as described above and thus, the overlapped description will be omitted.

In FIG. 13, the processor 900 and the timing controller 810 are separate elements. However, in an implementation, the timing controller 810 may perform a function of the processor 900 without the processor 900.

Figure 14:
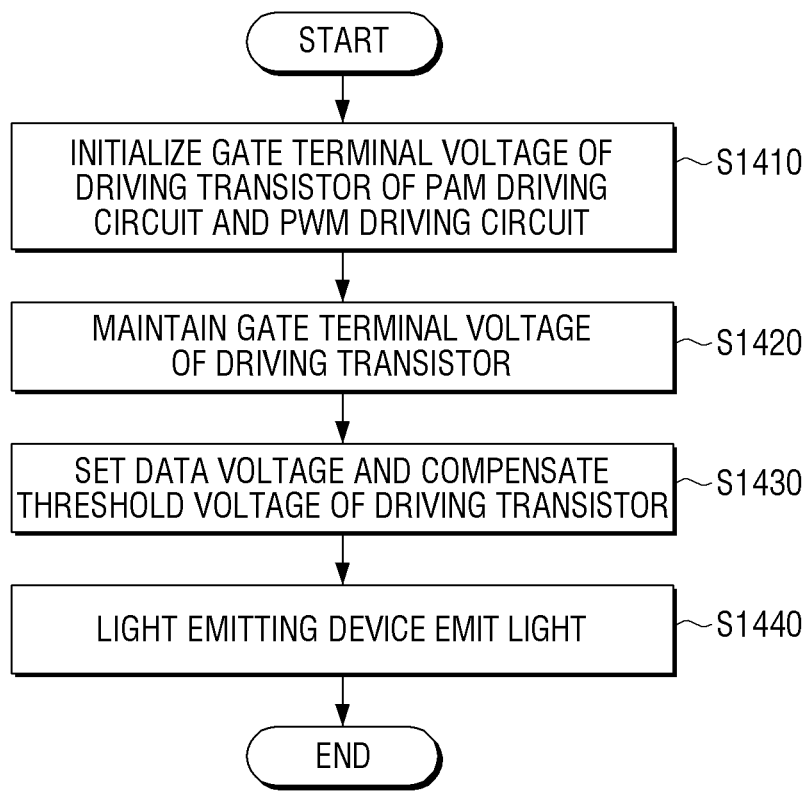
FIG. 14 is a flowchart illustrating a method for driving a display apparatus, according to an example embodiment.

FIG. 14 is a flowchart illustrating a method for driving a display apparatus, according to an example embodiment. In FIG. 14, the same elements described above will not be described in detail.

According to an example embodiment, the display panel 1000 and 1000' may be driven in the order of an initialization duration (Initialize), a maintain duration (Hold), a data voltage setup duration and threshold voltage (Vth) compensation duration, and an light emitting duration (Emitting) for one image frame.

Referring to FIG. 14, the display panel 1000 and 1000' may initialize voltages of gate terminals C and A of the first and second driving transistors 311 and 321 of the PAM driving circuit 310 and the PWM driving circuit 320 during an initialization duration, at operation S1410.

When the initialization duration is ended, a voltage of a driving voltage terminal is shifted. However, to prevent this shift from being coupled to the gate terminals C and A of the driving transistors 311 and 321, the display panel 1000 and 1000' may maintain the voltages of the gate terminals C and A of the driving transistors 311 and 321 in an initialized state during the maintain duration (Hold), at operation S1420.

Then, the display panel 1000 and 1000' may set a data voltage, and compensate threshold voltages of the driving transistors 311 and 321, at operation S1430. For example, the display panel 1000 and 1000' may apply a voltage corresponding to the sum of a PWM data voltage and a threshold voltage of the second driving transistor 321 to the gate terminal A of the second driving transistor 321, and apply a voltage corresponding to the sum of a PAM data voltage and a threshold voltage of the first driving transistor 311 to the gate terminal C of the first driving transistor 311.

The PWM data voltage may be applied for each of pixel lines included in the display panel 1000 and 1000', and the PAM data voltage may be applied at once to all pixels (or all sub pixels) included in the display panel 1000 and 1000'.

Here, the PAM data voltage being "applied at once" to all the sub pixels included in the display panel 1000 and 1000' does not necessarily mean that the PAM data voltage is "applied at the same time" to all the sub pixels included in the display panel 1000 and 1000'.

That is, for example, in a case that a data line (Sig or PAM data (Block x)) is directly connected to all sub pixels included in the display panel 1000 and 1000', the voltage being "applied at once" may mean that the voltage is applied to all sub pixels at the same time.

However, in a case that the display panel 1000 and 1000' is implemented in such a way that a PAM data voltage applied to pixels is time-divided through a MUX and applied to a sub pixel, the PAM data voltage is applied at once to the entire lines of the display panel 1000 and 1000', which does not necessarily mean that the voltage is applied to all sub pixels at the same time.

That is, a PAM data voltage being applied at once in the various example embodiments may mean that the PAM data voltage is applied at once to the entire lines rather than being sequentially applied for each line like the PWM data voltage (or the PAM data voltage in the external compensation method).

Accordingly, the display panel 1000 and 1000' may express a grayscale or gradation by illuminating the light emitting device 200 through a driving current with amplitude corresponding to the PAM data voltage and a pulse width corresponding to the PWM data voltage, at operation S1440.

According to an example embodiment, the display panel 1000 and 1000' may discharge an electrical charge remaining in the light emitting device 200 after the light emitting duration ends as described above.

In the example described above, the light emitting device 200 is a micro LED, but is not limited thereto. That is, according to an example embodiment, even when the light emitting device 200 is an LED of a size greater than or equal to 100 micrometers, the driving circuit 300 according to the various example embodiments described above may be applied.

In addition, in the example described above, the display panel 1000 and 1000' is a chip-on-glass (COG) type, but the driving circuit 300 according to the various example embodiments described above may be applied to a display panel of a chip-on-board (COB) type. As for a display panel of a COB type, a substrate is used instead of the glass 100 unlike the COG type. In this case, a hole penetrating the substrate is formed and one surface of the substrate and the other surface of the substrate are electrically connected through the hole, and thereby the driving circuit 300 provided on one surface of the substrate and various circuits provided on the other surface of the substrate can be electrically connected to each other.

According to the various example embodiments, a wavelength shift of a light emitted from an inorganic light emitting device included in a display panel according to a grayscale or gradation can be prevented.

In addition, it is possible to correct a stain or color of the light emitting device included in the display panel, and even in a case that a large-area tiled display panel is configured by combining a display panel in the form of a plurality of modules, a difference of brightness or color among the respective modular display panels can be corrected.

Further, a more optimized driving circuit design is enabled so that the inorganic light emitting device can be driven more stably and efficiently, thereby contributing to a miniaturization and lightening of a display panel.

In addition, it is possible to realize an HDR by the magnitude desired by the engineer. In addition, a capacitor is not used in the internal compensation circuit and a coupling noise caused by a peripheral parasitic capacitance is eliminated, and thereby circuit driving performance can be improved.

Meanwhile, the above-described example embodiments may be implemented as an S/W program including an instruction stored on machine (e.g., computer)-readable storage media. The machine is an apparatus which is capable of calling a stored instruction from the storage medium and operating according to the called instruction, and may include a display apparatus 1200 according to the above-described example embodiments.

When the command is executed by a processor, the processor may perform a function corresponding to the command directly or using other components under the control of the processor. The command may include a code generated or executed by a compiler or an interpreter. A machine-readable storage medium may be provided in the form of a non-transitory storage medium. Herein, the term "non-transitory" only denotes that a storage medium does not include a signal but is tangible, and does not distinguish the case where a data is semi-permanently stored in a storage medium from the case where a data is temporarily stored in a storage medium.

According to an example embodiment, the method according to the above-described various example embodiments may be provided as being included in a computer program product. The computer program product may be traded as a product between a seller and a consumer. The computer program product may be distributed in the form of (e.g., a compact disc read only memory (CD-ROM)) or through an application store (e.g., Playstore™). In the case of online distribution, at least a portion of the computer program product may be at least temporarily stored or temporarily generated in a server of the manufacturer, a server of the application store, or a storage medium such as memory.

Each of the components (e.g., module or program) according to the various example embodiments may include a single entity or a plurality of entities, and some of the corresponding sub components described above may be omitted, or another sub component may be further added to the various example embodiments. Alternatively or additionally, some of the components (e.g., module or program) may be integrated into one entity and may perform a function carried out by each of the corresponding components before integration in the same or similar manner. Alternatively or additionally, some components (e.g., module or program) may be combined to form a single entity which performs the same or similar functions as the corresponding elements before being combined. Operations performed by a module, a program, or other component, according to various exemplary embodiments, may be sequential, parallel, or both, executed iteratively or heuristically, or at least some operations may be performed in a different order, omitted, or other operations may be added.

Although example embodiments of the present disclosure have been illustrated and described, it should be understood that the present disclosure is not limited to the disclosed embodiments and may be variously changed without departing from the spirit and the scope of the present disclosure. While the disclosure has been shown and described with reference to various embodiments thereof, it will be understood by those skilled in the art that various changes in form and details may be made therein without departing from the spirit and scope of the disclosure as defined by the appended claims and their equivalents. While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. A display panel in which a plurality of pixels respectively including a plurality of sub pixels are arranged in a matrix form on a glass, wherein each of the plurality of sub pixels comprises:
    a driving circuit disposed on the glass and configured to receive a pulse amplitude modulation (PAM) data voltage and a pulse width modulation (PWM) data voltage; and
    an inorganic light emitting device mounted on the driving circuit and configured to be electrically connected to the driving circuit, and to emit a light based on a driving current provided from the driving circuit,
    wherein the PAM data voltage is applied at once to the plurality of pixels included in the display panel, and
    wherein the driving circuit is configured to control a grayscale of a light emitted by the inorganic light emitting device by controlling a pulse width of a driving current having an amplitude corresponding to the applied PAM data voltage based on the applied PWM data voltage.

2. The display panel as claimed in claim 1, wherein the driving circuit comprises:
    a PAM driving circuit including a first driving transistor and configured to control an amplitude of the driving current based on the applied PAM data voltage; and
    a PWM driving circuit including a second driving transistor and configured to control a pulse width of the driving current based on the applied PWM data voltage.

3. The display panel as claimed in claim 2, wherein the PAM driving circuit is configured to, based on the PAM data voltage being applied, apply a first voltage based on a threshold voltage of the first driving transistor and the applied PAM data voltage to a gate terminal of the first driving transistor, and
    wherein the PWM driving circuit is configured to, based on the PWM data voltage being applied, apply a second voltage based on a threshold voltage of the second driving transistor and the applied PWM data voltage to a gate terminal of the second driving transistor.

4. The display panel as claimed in claim 3, wherein the driving circuit is configured to, based on a driving voltage driving the driving circuit being applied to the inorganic light emitting device through the first driving transistor and a linearly-shifting sweep signal being applied to the PWM driving circuit, provide a driving current having an amplitude corresponding to the applied PAM data voltage to the inorganic light emitting device from a time when the driving voltage is applied to the inorganic light emitting device until a time when the second voltage applied to the gate terminal of the second driving transistor is linearly shifted according to the sweep signal and becomes the threshold voltage of the second driving transistor.

5. The display panel as claimed in claim 3, wherein the PAM driving circuit includes a first transistor which is connected to in between a drain terminal of the first driving transistor and the gate terminal of the first driving transistor; and
    a second transistor including a drain terminal connected to a source terminal of the first driving transistor, and a gate terminal connected to a gate terminal of the first transistor.

6. The display panel as claimed in claim 5, wherein the PAM driving circuit is configured to, while the first and second transistors are turned on, based on the PAM data voltage being applied via a source terminal of the second transistor, apply the first voltage corresponding to a sum of the applied PAM data voltage and the threshold voltage of the first driving transistor to the gate terminal of the first driving transistor via a turned-on first driving transistor.

7. The display panel as claimed in claim 5, wherein the PWM driving circuit comprises:
    a third transistor which is connected to in between a drain terminal of the second driving transistor and a gate terminal of the second driving transistor; and
    a fourth transistor including a drain terminal connected to a source terminal of the second driving transistor, and a gate terminal connected to a gate terminal of the third transistor.

8. The display panel as claimed in claim 7, wherein the PWM driving circuit is configured to, while the third and fourth transistors are turned on, based on the PWM data voltage being applied via a source terminal of the fourth transistor, apply the second voltage corresponding to a sum of the applied PWM data voltage and the threshold voltage of the second driving transistor to the gate terminal of the second driving transistor via a turned-on second driving transistor.

9. The display panel as claimed in claim 7, wherein the driving circuit further comprises:
   a fifth transistor including a source terminal connected to a driving voltage terminal of the driving circuit, and a drain terminal commonly connected to a drain terminal of the fourth transistor and a source terminal of the second driving transistor;
   a sixth transistor including a source terminal connected to a drain terminal of the second driving transistor, a drain terminal connected to the gate terminal of the first driving transistor;
   a seventh transistor including a source terminal connected to the source terminal of the second driving transistor, and commonly connected to the drain terminal of the fourth transistor and the drain terminal of the fifth transistor, and a drain terminal commonly connected to a source terminal of the first driving transistor and the drain terminal of the second transistor;
   an eighth transistor including a source terminal connected to the drain terminal of the first driving transistor, and a drain terminal connected to an anode terminal of the inorganic light emitting device; and
   a first capacitor including a first terminal commonly connected to the gate terminal of the second driving transistor and a drain terminal of the third transistor, and a second terminal receiving a linearly-shifting sweep signal,
   wherein a cathode terminal of the inorganic light emitting device is connected to a ground voltage terminal of the driving circuit.

10. The display panel as claimed in claim 9, wherein the driving circuit is configured to:
    drive the PAM driving circuit and the PWM driving circuit independently of each other while the fifth to eighth transistors are turned off, and apply the first voltage and the second voltage to the gate terminal of the first driving transistor and the gate terminal of the second driving transistor, respectively; and
    while the fifth to eighth transistors are turned on, based on the sweep signal being applied via the first capacitor, drive the PAM driving circuit and the PWM driving circuit together, and until the second voltage applied to the gate terminal of the second driving transistor is shifted according to the sweep signal and becomes the threshold voltage of the second driving transistor, provide a driving current having an amplitude corresponding to the applied PAM data voltage to the inorganic light emitting device.

11. The display panel as claimed in claim 9, wherein the driving circuit further comprises:
    a ninth transistor including a drain terminal commonly connected to the gate terminal of the first driving transistor and the drain terminal of the first transistor, and a source terminal receiving an initial voltage;
    a tenth transistor including a source terminal connected to the first terminal of the first capacitor, and a drain terminal connected to the source terminal of the ninth transistor; and
    a second capacitor including a first terminal connected to the driving voltage terminal, and a second terminal commonly connected to the gate terminal of the first driving transistor, the drain terminal of the first transistor, the drain terminal of the ninth transistor, and the drain terminal of the sixth transistor.

12. The display panel as claimed in claim 11, wherein the driving circuit is configured to:
    based on the ninth transistor and the tenth transistor being turned on, initialize gate terminal voltages of the first and second driving transistors by applying the initial voltage to the gate terminal of the first driving transistor and the gate terminal of the second driving transistor; and
    to prevent a driving voltage from being coupled to the gate terminal of the first driving transistor via the second capacitor after the gate terminal voltages of the first and second driving transistors are initialized, apply the initial voltage to the gate terminals of the first and second driving transistors via the turned-on ninth and tenth transistors even after the driving voltage is applied to the first terminal of the second capacitor.

13. The display panel as claimed in claim 11, wherein the driving circuit further comprises:
    an eleventh transistor connected to in between the anode terminal of the inorganic light emitting device and the cathode terminal of the inorganic light emitting device.

14. The display panel as claimed in claim 13, wherein the eleventh transistor is configured to:
    before the inorganic light emitting device is mounted on the driving circuit, be turned on to check whether the driving circuit is abnormal; and
    after the inorganic light emitting device is mounted on the driving circuit, be turned on to discharge an electric charge remaining in the inorganic light emitting device.

15. The display panel as claimed in claim 2, wherein the display panel is divided into a plurality of areas, and
    wherein the PAM driving circuit receives the PAM data voltage for each of the plurality of areas.

16. The display panel as claimed in claim 15, wherein a PAM data voltage applied to at least one area for driving a high dynamic range (HDR) from among the plurality of areas is different from a PAM data voltage applied to other areas of the plurality of areas.

17. The display panel as claimed in claim 1, wherein the PWM data voltage is sequentially applied to the plurality of pixels for each line of the plurality of pixels arranged in the matrix form.

18. The display panel as claimed in claim 1, wherein the PAM data voltage applied at once to the plurality of pixels is a voltage of a same magnitude.

19. The display panel as claimed in claim 1, wherein the plurality of sub pixels include an R sub pixel including an inorganic light emitting device emitting a red (R) light, a G sub pixel including an inorganic light emitting device emitting a green (G) light, and a B sub pixel including an inorganic light emitting device emitting a blue (B) light.

20. A method for driving a display panel comprising a plurality of pixels respectively including a plurality of sub pixels arranged in a matrix form on a glass, wherein each of the plurality of sub pixels comprises:
    a driving circuit formed on the glass and configured to receive a pulse amplitude modulation (PAM) data voltage and a pulse width modulation (PWM) data voltage; and
    an inorganic light emitting device mounted on the driving circuit and configured to be electrically connected to the driving circuit, and to emit a light based on a driving current provided from the driving circuit,
    wherein the driving circuit comprises:

a PAM driving circuit including a first driving transistor and configured to control an amplitude of the driving current based on the applied PAM data voltage; and a PWM driving circuit including a second driving transistor and configured to control a pulse width of the driving current based on the applied PWM data voltage, wherein the method comprises:

based on the PAM data voltage being applied to the PAM driving circuit, compensating the applied PAM data voltage to the threshold voltage of the first driving transistor, and based on the PWM data voltage being applied to the PWM driving circuit, compensating the applied PWM data voltage to the threshold voltage of the second driving transistor; and based on the compensated PWM data voltage and the compensated PAM data voltage, providing, to the inorganic light emitting device, a driving current having an amplitude corresponding to the applied PAM data voltage and a pulse width corresponding to the applied PWM data voltage, wherein the PAM data voltage is applied at once to the plurality of pixels included in the display panel.

* * * * *